(12) United States Patent
Foslien et al.

(10) Patent No.: US 6,183,053 B1
(45) Date of Patent: Feb. 6, 2001

(54) BEZEL ASSEMBLY AND METHOD OF PRODUCTION

(75) Inventors: Wayne E. Foslien, Greeley; Joseph M. White, Windsor, both of CO (US); Seiya Ohta, Rocklin, CA (US)

(73) Assignee: Hewlett-Packard Co., Palo Alto, CA (US)

( * ) Notice: Under 35 U.S.C. 154(b), the term of this patent shall be extended for 0 days.

(21) Appl. No.: 09/295,491

(22) Filed: Apr. 20, 1999

(51) Int. Cl.[7] ................................................. A47B 47/00
(52) U.S. Cl. ............................ 312/265.6; 312/223.2; 312/348.4
(58) Field of Search ................................. 312/204, 213, 312/223.1, 223.2, 265.5, 265.6, 348.4, 108, 107; 361/724, 725, 727, 728, 729, 730, 735

(56) References Cited

U.S. PATENT DOCUMENTS

| | | | |
|---|---|---|---|
| D. 394,431 | * 5/1998 | Dow et al. ............................. | D14/115 |
| D. 419,148 | * 1/2000 | Foslien et al. ........................ | D14/115 |
| D. 419,983 | * 2/2000 | Foslien et al. ........................ | D14/115 |
| 5,397,176 | * 3/1995 | Allen et al. ...................... | 312/265.6 X |
| 5,547,272 | * 8/1996 | Paterson et al. ................ | 312/265.6 X |
| 5,604,662 | * 2/1997 | Anderson et al. ................. | 312/204 X |
| 5,647,649 | * 7/1997 | Kao .................................. | 312/265.5 X |
| 5,940,274 | * 8/1999 | Sato et al. ........................ | 312/223.2 X |

OTHER PUBLICATIONS

U.S. application Ser. No. 09/137,350 filed, Aug. 20, 1998 for Modular Data Storage System of Joseph White, Matthias Lester and Dave Jones; Attorney Docket No. 10971954–1/HP–331.

U.S. application Ser. No. 09/294,965 filed, Apr. 20, 1999 for Adjustable Bezel Assembly of Wayne E. Foslien; Attorney Docket No. 10990598–1/HP–436.

U.S. application Ser. No. 09/311,243, filed May 13, 1999 for Data Storage System with Redundant Media Handling Assemblies of Joseph M. White (Attorney Docket No. 10990043–1/HP–407).

U.S. application Ser. No. 09/311,831, filed May 13, 1999 for Modular Data Storage System with Expandible Vertical Lift Mechanism of Joseph M. White and Matthias Lester (Attorney Docket No. 10982221–1/HP–409).

* cited by examiner

Primary Examiner—Janet M. Wilkens

(57) ABSTRACT

A group of identical bezel plates having bilateral symmetry interchangeable, in a compound bezel assembly, with at least one other group of identical bezel plates having bilateral symmetry to produce multiple, bilaterally symmetrical, compound bezel configurations with different appearances using a minimal number of component plates; and method and apparatus for providing a venting bezel assembly with a plenum chamber formed between component plates.

12 Claims, 22 Drawing Sheets

BEZEL ASSEMBLY AND METHOD OF PRODUCTION

RELATED PATENT APPLICATIONS

This patent application contains subject matter related to U.S. patent application Ser. No. 09/294,965, filed Apr. 20, 1999 for ADJUSTABLE BEZEL ASSEMBLY of Foslien filed on the same date as the present application, which is hereby incorporated by reference for all that is disclosed therein.

FIELD OF THE INVENTION

The present invention relates generally to the production of bezel assemblies and, more particularly, to the cost effective production of multiple bezel assemblies with different appearances through the use of interchangeable component plates.

BACKGROUND OF THE INVENTION

Many devices used in the computer, telecommunications, electronics and other industries are mounted in sheet metal housings which are in turn mounted in a vertical rack assembly. Rack mounts have long been used in electronics instrumentation applications to mount housings containing various instruments such as voltmeters, signal generators, oscilloscopes, and power supplies. The telecommunications and networking industry often mount switching assemblies and other components in rack mounted housings. Examples of rack mounted housings applications in the home electronics industry include stereo components and home entertainment center audio and video components. In the computer industry computers and computer peripherals including mass storage devices such as tapes, optical disks, CD-ROMs, DVDs are provided in rack mounted sheet metal housings. Sheet metal housings are also used to house peripheral devices such as DVD drives which are fixedly or removable mounted in bays within a larger computer housing.

In rack mounted housings, and some other types of housings as well, an assembly known as a "bezel assembly" or simply "bezel" is attached to the front face of the housing. In some cases the bezel has no function other than to provide a "finished" appearance to the portion of the housing which is visible to users. In other cases the bezel may contain an opening, such as for insertion or removal of media, control knobs or buttons, viewable displays or other functional features. However even with such functional bezels, the appearance of the bezel is usually considered very important to the organization which markets the associated product. In many cases the bezel is the only feature of the product which the end user actually sees.

In many industries one company, generally referred to as an "original equipment manufacturer" or "OEM", manufactures a particular product which it sells to other companies. Each of these other companies subsequently sells the product under its own trademark or brand name, either to distributors or directly to end users. In such cases the company selling to the distributors/end users may require the OEM to provide visual marking that identifies the product with the company selling to distributors/end users. For products sold in housings, this identifying visual marking is often provided by customizing the housing's bezel. However, producing customized bezels for its different customers typically significantly increase an OEM's manufacturing costs. If the OEM simply sells the same identical product to each of its customers it is able to maintain relatively low production costs since the same machinery, tooling and production steps may be used for producing all of the products. If the OEM produces a customized bezel for each of its customers, separate bezel tooling must be created for each customer and, depending upon the bezels, special assembly techniques and/or components may be required as well.

It would be generally desirable to provide a bezel assembly of a type which may be efficiently and inexpensively produced in a plurality of different configurations, each having a unique appearance.

SUMMARY OF THE INVENTION

The present invention is directed to a method and apparatus for producing multiple bezel assemblies having different appearances.

Thus the invention may comprise a bezel assembly for a modular rack mounted device comprising a unitary central plate having a central longitudinal plane extending parallel to its lateral side face portions. The central plate is symmetrical about the central longitudinal plane. The bezel assembly includes a first side plate having a central longitudinal plane extending parallel to its lateral side face portions, and having a central lateral plane extending parallel to its top and bottom face portions. The first side plate is bilaterally symmetrical about at least one of the central planes thereof and is disposed with one of the lateral side face portions thereof in adjacent relationship with a first lateral side face portion of the central plate. The bezel assembly includes a second side plate identical to the first side plate having a central longitudinal plane extending parallel to its lateral side face portions, and having a central lateral plane extending parallel to its top and bottom face portions. The second side plate is bilaterally symmetrical about at least one of the central planes thereof and is disposed with one of the lateral side face portions thereof in adjacent relationship with the second lateral side face portion of a central plate.

The invention may also comprise a method of producing housing assemblies including:
  a) providing a plurality of identical housing frames;
  b) providing a plurality of identical central bezel plates each being bilaterally symmetrical about a plane of symmetry;
  c) providing a plurality of first identical side plates, each having a front face portion with a first front surface configuration, first and second parallel lateral side face portions and each being bilaterally symmetrical about a plane of symmetry;
  d) providing one or more other sets of identical side plates including at least a plurality of second identical side plates, each having a front surface configuration different from said the front surface configuration of the first side plates and each being bilaterally symmetrical about a plane of symmetry;
  e) mounting pairs of the plurality of identical first side plates on individual ones of the plurality of identical housing frames with one of the identical central plates disposed between each of the pairs of first side plates in a plate arrangement which is bilaterally symmetrical about the plane of symmetry of the central plate to provide a plurality of housing assemblies having a first bezel configuration;
  f) mounting pairs of the plurality of identical second side plates on individual ones of the plurality of identical housing frames with one of the identical central plates disposed between each of the pairs of second side plates in a plate arrangement which is bilaterally symmetrical about the plane of symmetry of the central plate to provide a plurality of housing assemblies having a second bezel configuration.

The invention may also comprise a bezel assembly including a first plate and a second plate each having at least one vent passage extending therethrough. The second plate is mountable in overlying peripherally abutting relationship with the first plate with at least one interior portion thereof positioned in spaced relationship with an oppositely positioned portion of the first plate. A plenum chamber is formed between the first and second plates with the vent passages in the first and second plates being in fluid communication with the plenum chamber. The plenum chamber obviates aligning the vent passages of the two plates to pass air through the two plate assembly.

BRIEF DESCRIPTION OF THE DRAWING

The objects and advantages of the invention will become more apparent and more readily appreciated from the following detailed description of the presently preferred exemplary embodiments of the invention taken in conjunction with the accompanying drawing, of which.

DETAILED DESCRIPTION OF THE EMBODIMENTS

Figure 1:
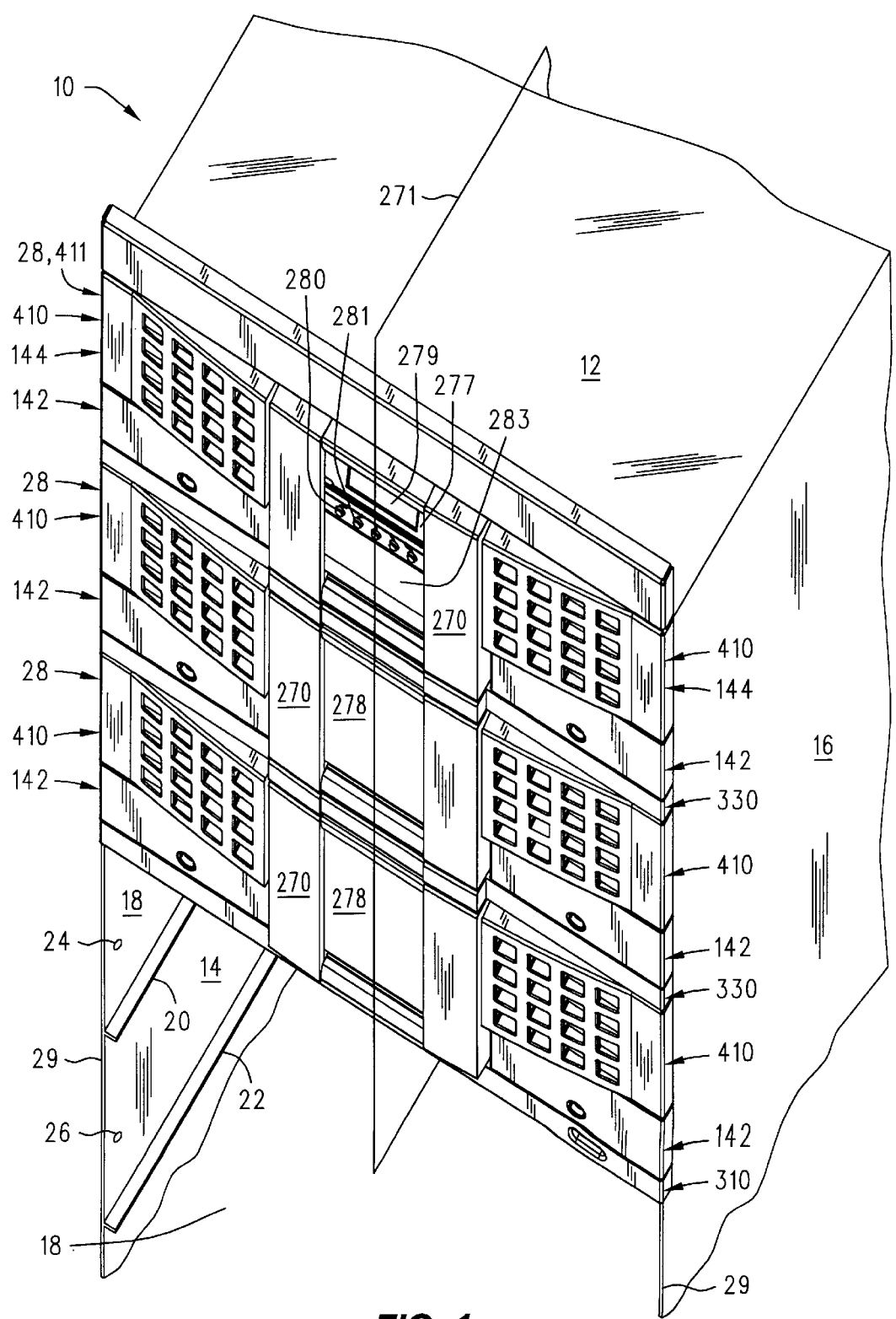
FIG. 1 is a front perspective view of three rack mounted housing modules having three identical front bezel assemblies.
Figure 21:
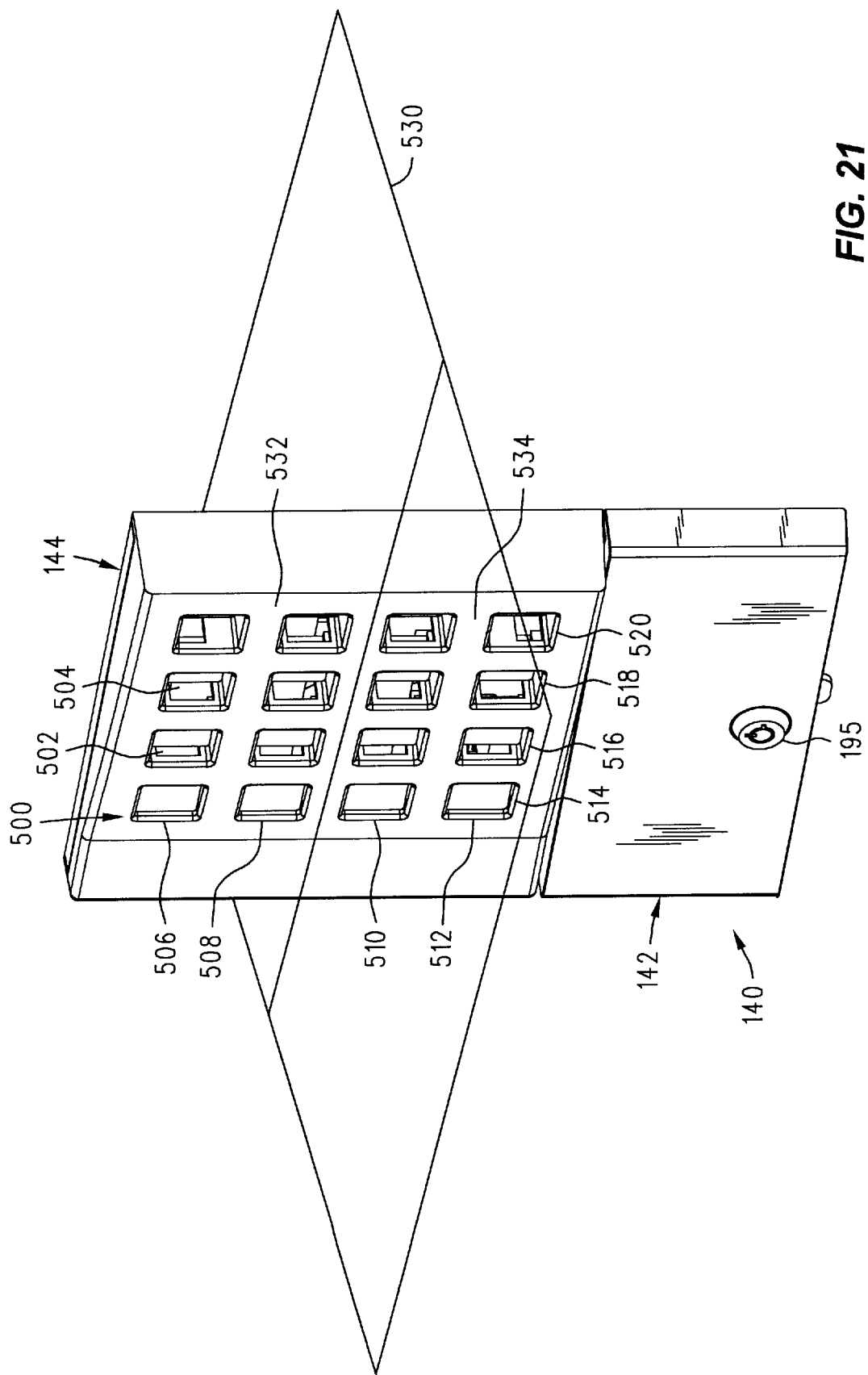
FIG. 21 is a front perspective view of a third configuration of a drawer bezel assembly.
Figure 22:
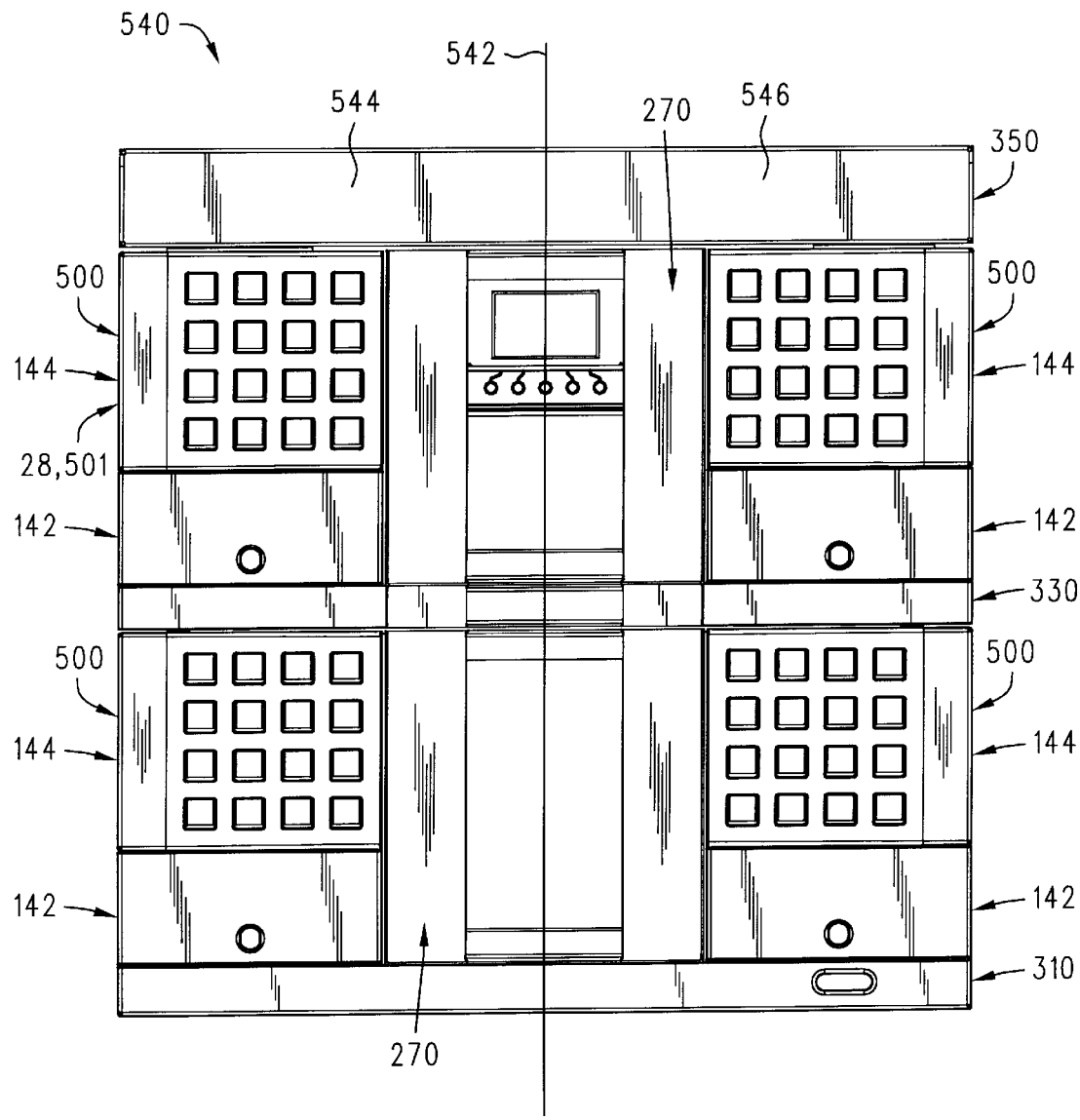
FIG. 22 is a front elevation view of two bezel assemblies mounted on associated housing units in a two stack rack mount format.
Figure 23:
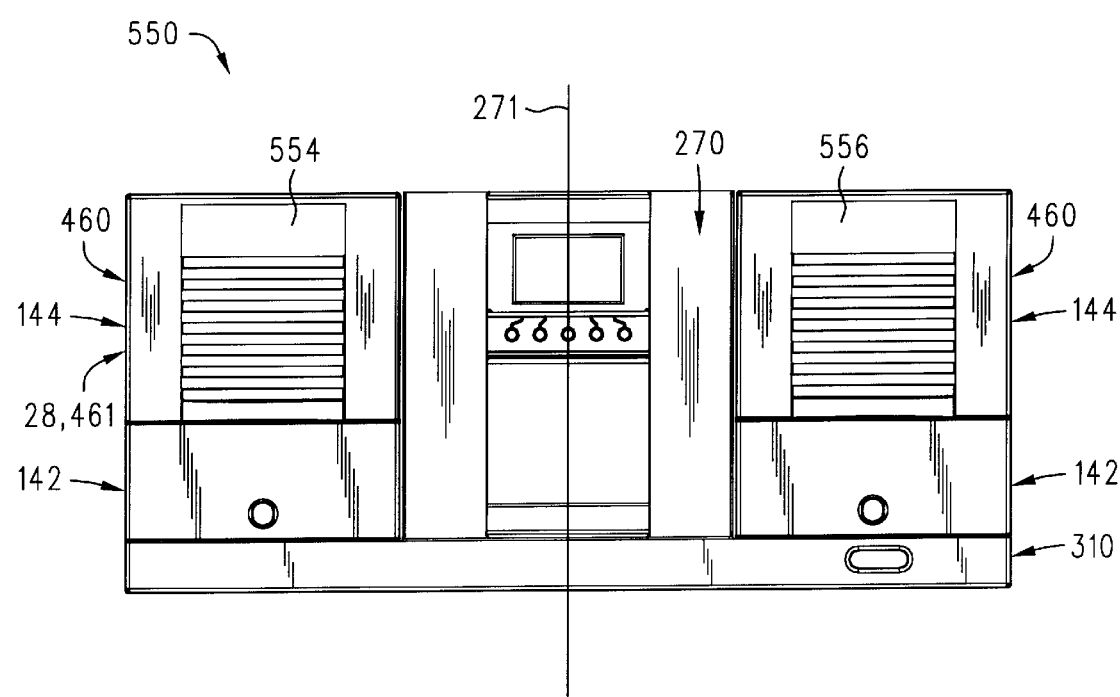
FIG. 23 is a front elevation view of a single bezel assembly associated with a single housing unit.

The drawing FIGS. 1–23, in general, illustrate method and apparatus for producing a plurality of different bezel assemblies 28 for housing modules 10. Such different bezel assemblies 411, 461, and 501 are shown in FIGS. 1, 23 and 22, respectively. The components of each bezel assembly include a plurality of identical central plates 270, FIG. 12, each being bilaterally symmetrical about a plane of symmetry 271 and having first and second lateral side face portions 292, 294 extending generally parallel to the plane of symmetry 271. Also included is a first plurality of identical side plates 410, FIG. 19, each having a front face portion 412 with a first front surface configuration, first and second parallel lateral side face portions 434, 436 and each being bilaterally symmetrical about a plane of symmetry 440 whereby a first one of the first plurality of identical side plates 410 is positionable with one of the lateral side face portions 434, 436 thereof in adjacent parallel relationship with the first lateral side face portion 292 of one of the central plates 270 and another of the first plurality of identical side plates 410 is positionable with one of the lateral side face portions 434, 436 thereof in adjacent parallel relationship with the second lateral side face portion 294 of the central plate 270 to provide a first three plate bezel configuration 411, FIG. 1, which is bilaterally symmetrical about the plane of symmetry 271 of said central plate 270.

Figure 20:
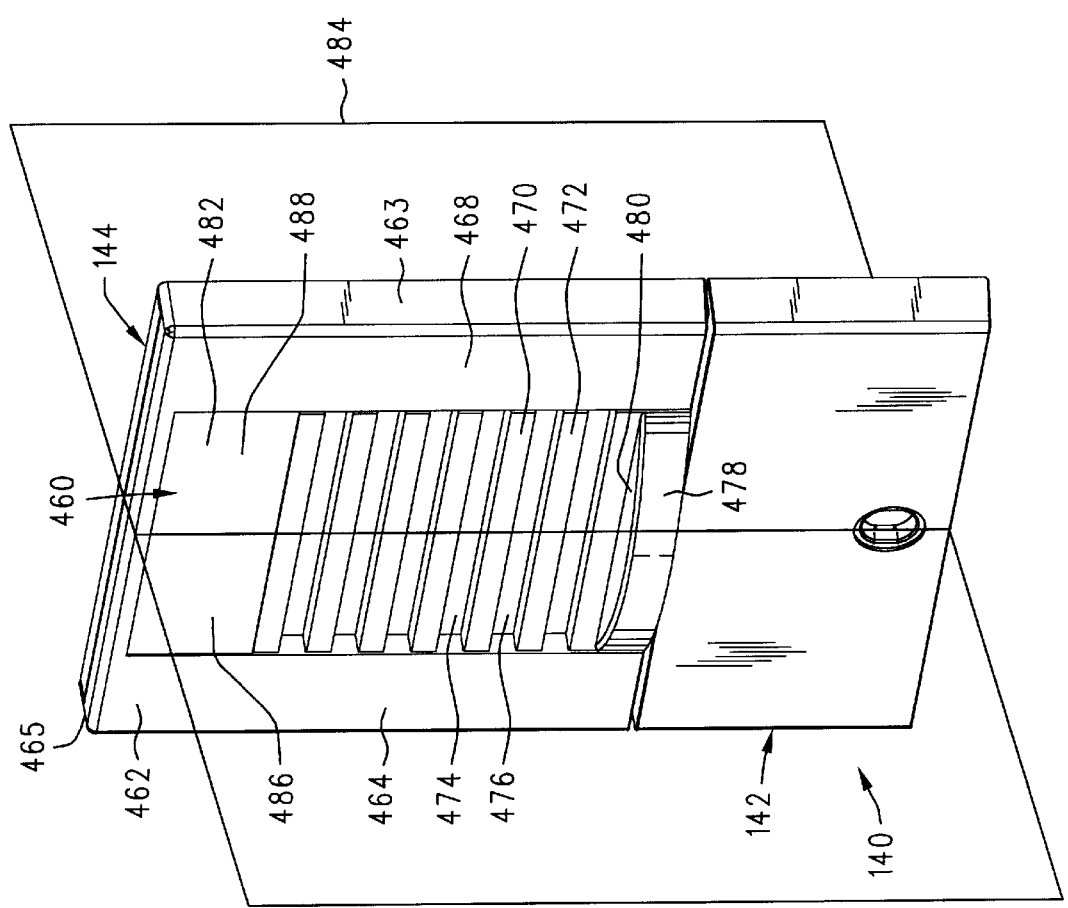
FIG. 20 is a front perspective view of a second configuration of a drawer bezel assembly.

The components also include a second plurality of identical side plates 460, FIG. 20, each having a front face portion 462 with a second front surface configuration different from the first front surface configuration. The second plurality of identical side plates 460 each have first and second parallel lateral side face portions 463, 465 and are bilaterally symmetrical about a plane of symmetry 484 whereby a first one of the second plurality of identical side plates is positionable with one of the lateral side face portions 463, 465 thereof in adjacent parallel relationship with the first lateral side face portion 492 of one of the central plates 270 and another of the second plurality of identical side plates 460 is positionable with one of the lateral side face portions 463, 465 thereof in adjacent parallel relationship with the second lateral side face portion 294 of the central plate 270 to provide a second three plate bezel configuration 461, FIG. 23, which is bilaterally symmetrical about the plane of symmetry 271 of the central plate 270 and which is different in appearance from the first three plate bezel configuration 411.

Having thus described method and apparatus for forming multiple bezel assemblies in general, various components and subassemblies thereof will now be described in further detail.

FIG. 1 illustrates a standard rack frame 10 well known in the art having a top wall 12 a pair of side walls 14,16 and an open front face 18. Rack frames of this type are available under the product designation HP Rack System/E41 from Hewlett-Packard Company. A plurality of ribs 20, 22 or other bracket like components and screw holes 24, 26, etc. and the like enable sheet metal housings module units 30, FIGS. 2 and 3 to be mounted in stacked relationship within the rack frame 10. Rack frames may be provided in various heights to accommodate different numbers and sizes of housing units. For example, the rack assembly 10 illustrated in FIG. 1 is shown having three housing units stacked therein with open space below for the mounting of additional housing units of the same type or different types. Each of the three housing units positioned in rack 10 have an identical bezel assembly 28 mounted thereon which covers the front of the housing 30 and the front edge portion 29 of the rack frame 10.

Figure 2:
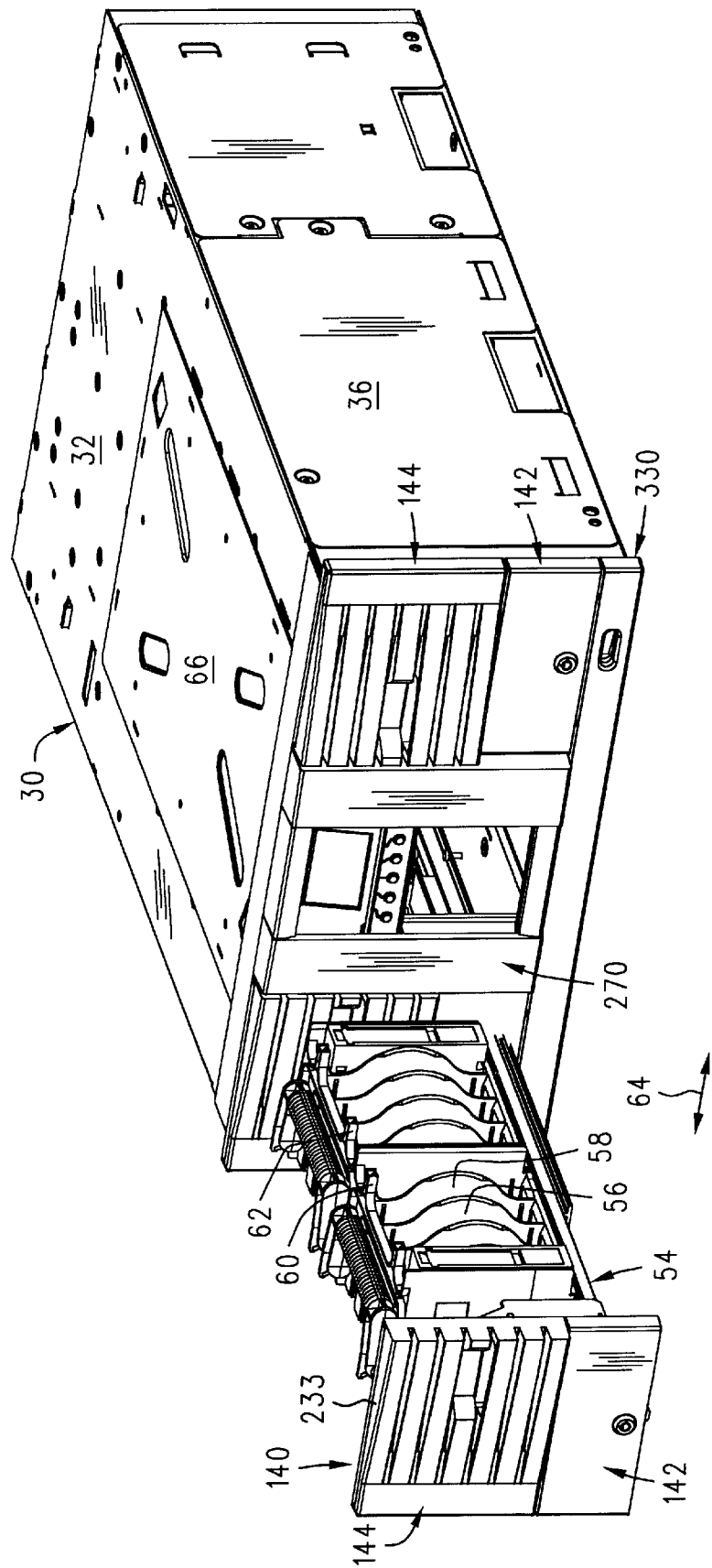
FIG. 2 is a front perspective view of one of the housing modules of FIG. 1 with one media drawer thereof extended.
Figure 3:
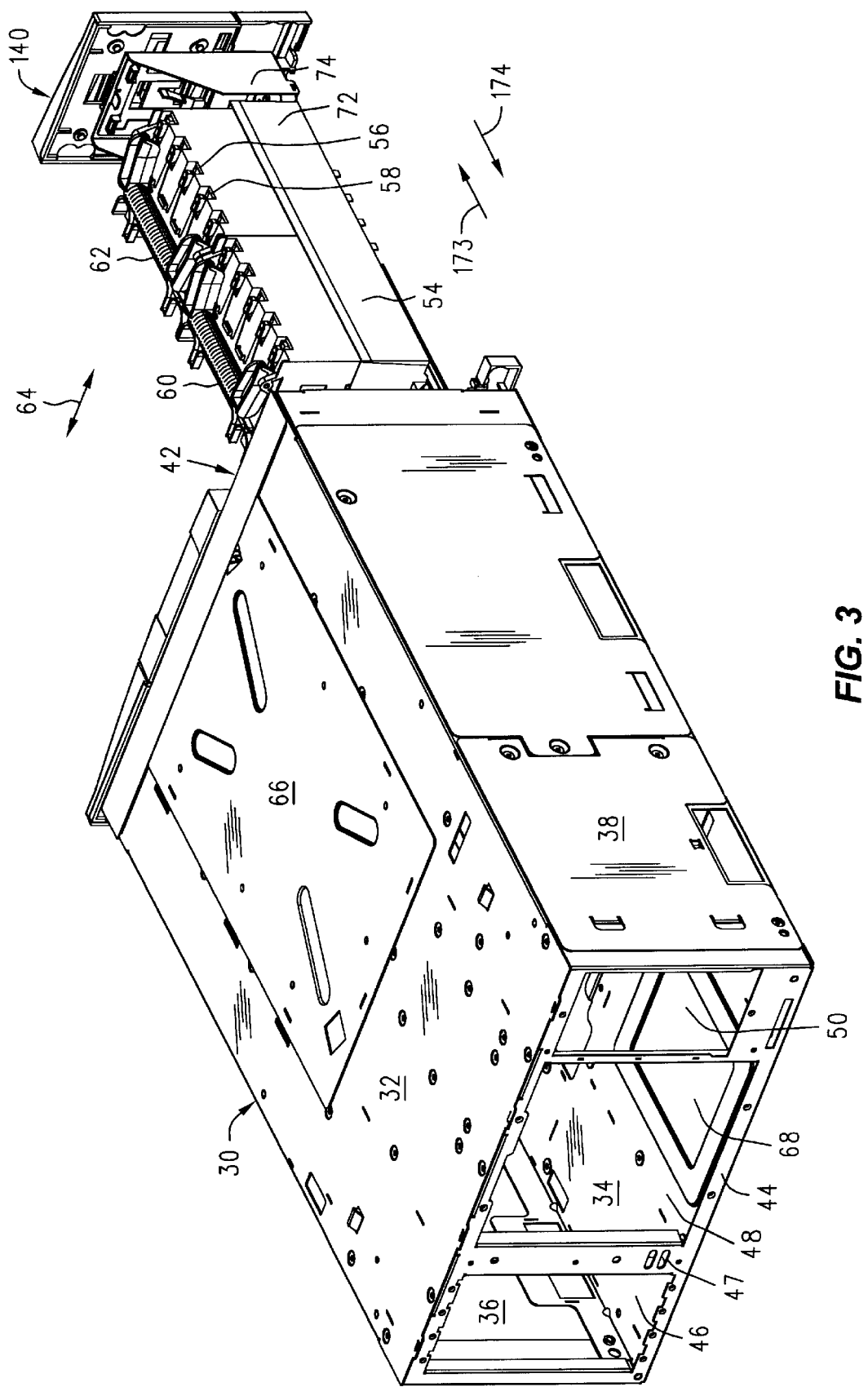
FIG. 3 is rear perspective view of the housing module of FIG. 2.
Figure 5:
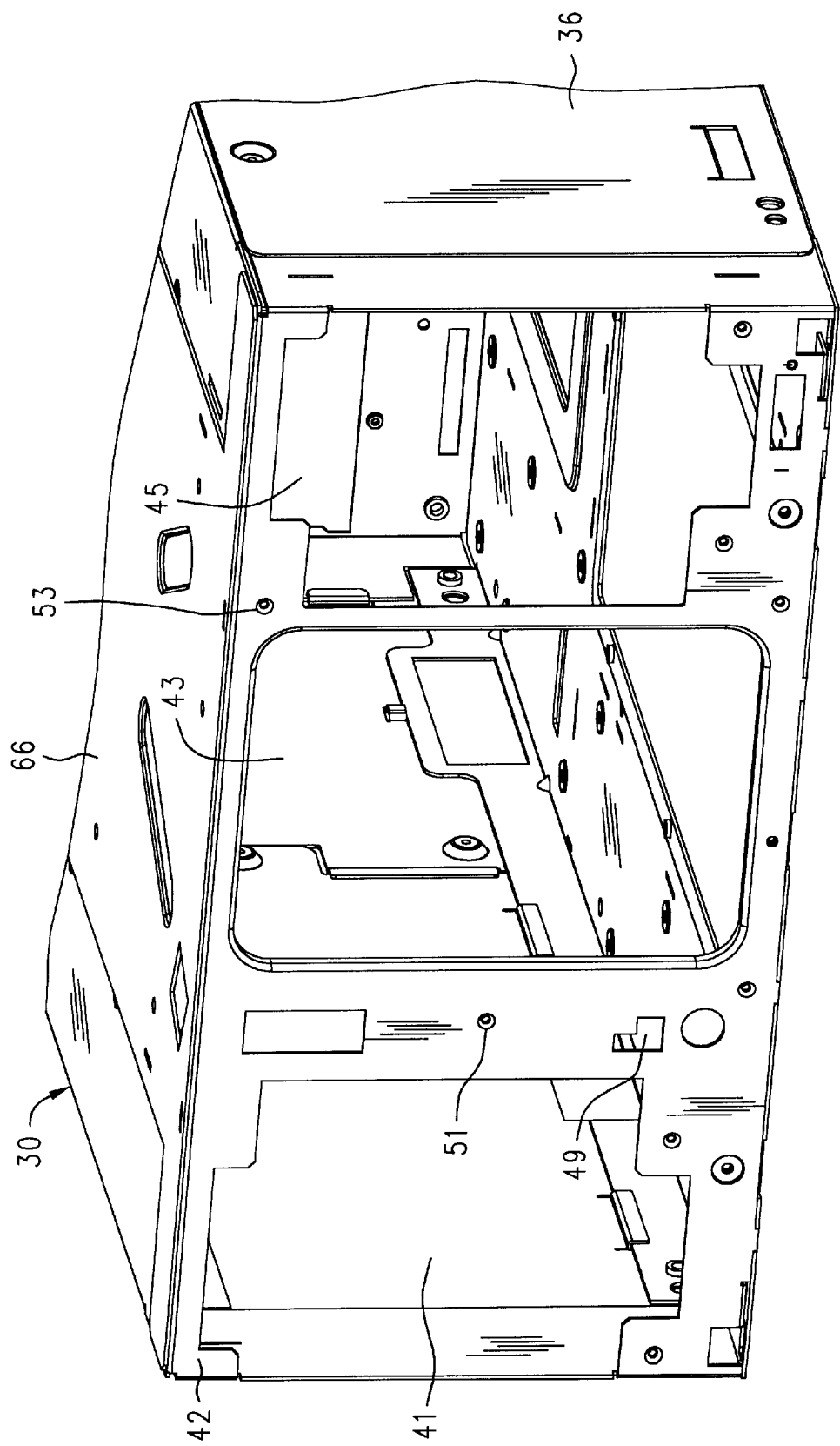
FIG. 5 is a front perspective view of the housing module of FIG. 2 with the front bezel assembly removed therefrom.

FIGS. 2, 3 and 5 illustrate a parallelepiped shaped (box shaped) housing 30 of a data storage media autochanger. The housing 30 has a top wall 32, a bottom wall 34 and lateral side walls 36, 38. As shown in FIG. 5 the housing 30 has a front wall 42 with left, central and right front wall opening 41, 43, 45 respectively, provided therein. As illustrated in FIG. 3 the housing comprises a rear wall 44 having rear wall openings 46, 48, 50. Each of the front and rear walls of the housing comprise a plurality of cutouts 47, 49, etc. and screw receiving bores 53, etc. provided therein.

As best illustrated in FIGS. 2 and 3 each of the housings 30 have mounted therein two identical media holding drawers 54 with slots 56, 58, etc. therein for receiving and holding data storage media 60, 62, etc. such as tape cartridges, optical disk cartridges, CD ROMs, DVDs, etc. The media 60, 62 are moved into and out of slots 56, 58 in the directions indicated at 64 by a picker assembly (not shown) such as described in detail in U.S. patent application Ser. No. 09/137,350 filed Aug. 20, 1998 for MODULAR DATA STORAGE SYSTEM of Joseph White, Matthias Lester and Dave Jones, Attorney Docket No. 10971954-1 which is hereby incorporated by reference for all that is disclosed therein. The housing 30 may comprise a plate 66 in its top wall if it is used as the upper most housing in the rack. When the housing is disposed below the top housing, plate 66 is removed. The bottom wall has a similar bottom wall plate (not shown) in aligned relationship with plate 66 which remains in place if the housing 30 is the lower most housing in the stack. Otherwise the bottom housing plate is removed. As described in detail in the above referenced patent application of White et al. a picker assembly may move vertically between the housings units 30 of the stacked array in one autochanger embodiment. In other autochanger embodiments each of the housings units 30 may have a picker assembly which accesses data media only within that single housing. A rear portion 68 of the housing may have media drives (not shown) mounted therein which may also be accessed by the picker assembly.

Figure 7:
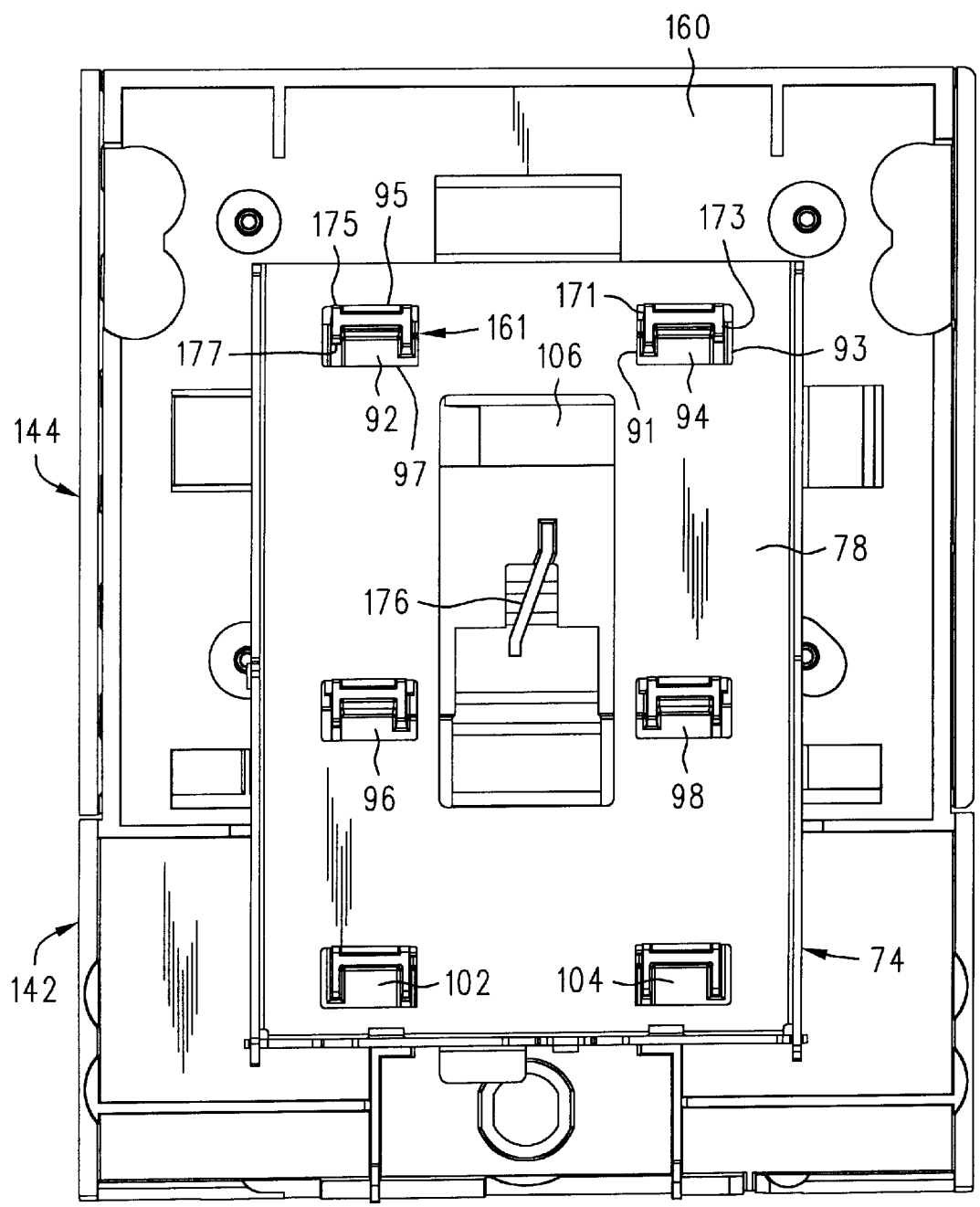
FIG. 7 is a rear elevation view of a drawer bezel assembly received in a drawer mounting bracket.

Each media drawer 54, FIGS. 2 and 3, has a front end portion 72 on which is mounted, as by brackets, screws, clips, or any other attachment means a bracket 74. The bracket 74, FIG. 4, has a bottom wall portion 76, a central wall portion 78, and two lateral sidewall portions 82, 84. The central wall portion 78 has a plurality of holes 92, 94, 96, 98, 102, 104, 106, FIG. 7, provided therein. The holes may be rectangular in shape, each having lateral edge portions 91, 93 and top and bottom edged portions 95, 97.

Figure 4:
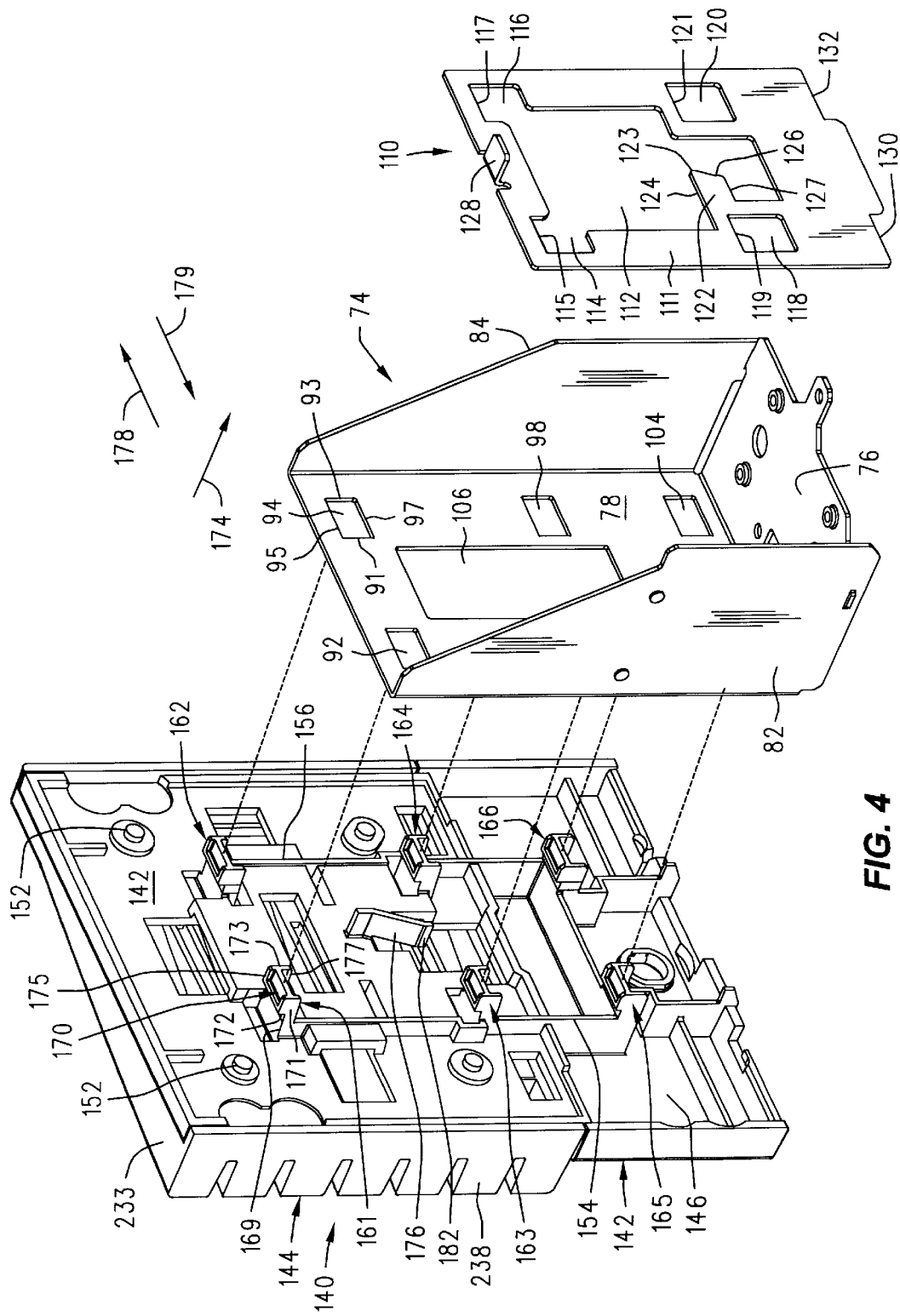
FIG. 4 is a rear perspective view of a drawer bracket and a drawer bezel assembly and lock plate associated therewith.
Figure 8:
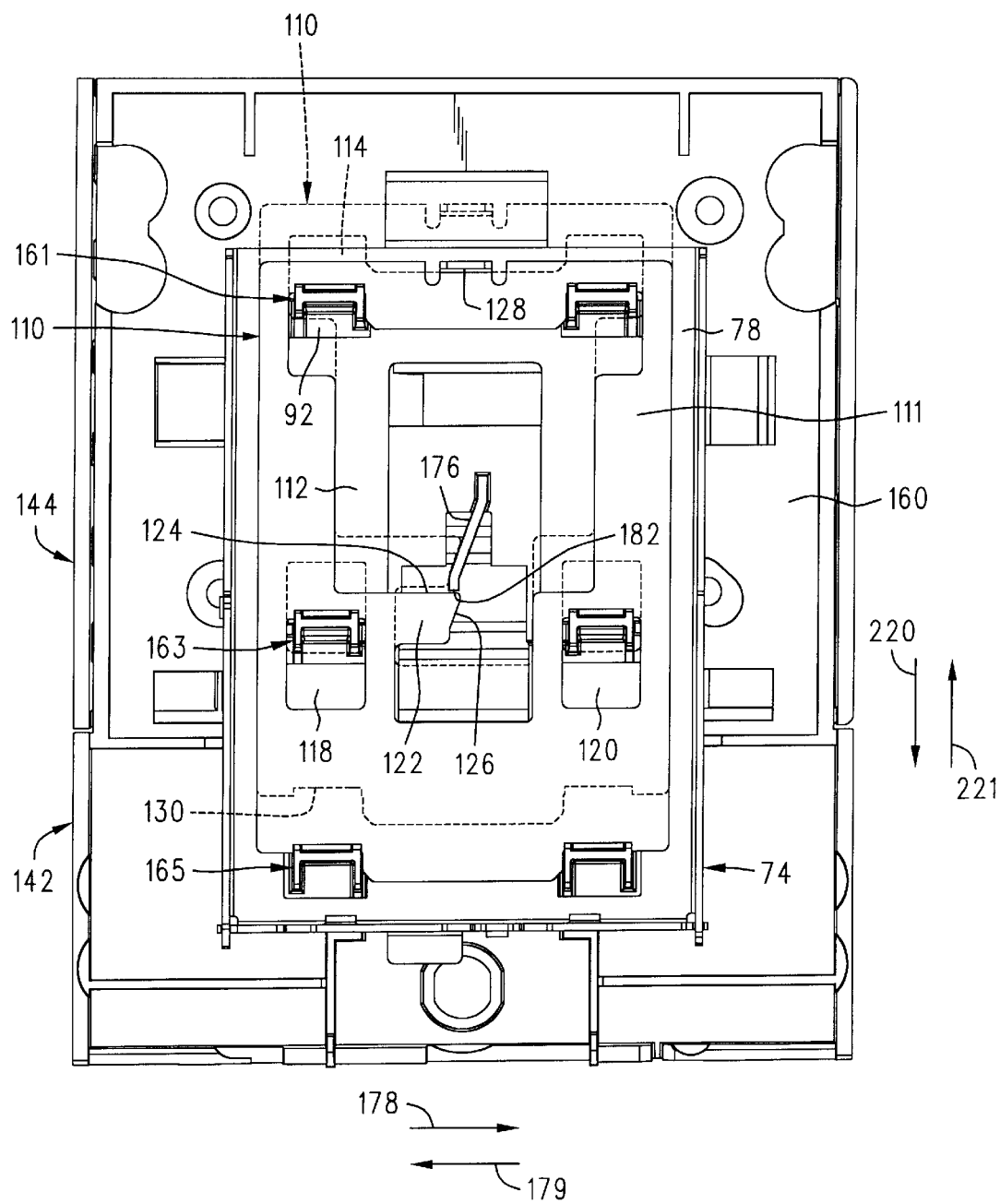
FIG. 8 is a rear elevation view of a drawer bezel assembly received in a drawer mounting bracket and locked into position with a lock plate.

Attachment of a drawer bezel assembly 140 to bracket 74 is facilitated by a snap-on attachment plate 110 shown in FIGS. 4 and 8. The snap-on plate 110 has a large central cutout 112 with partially rectangular upper corner portions 114, 116 and has lower rectangular shaped cutouts 118, 120. Cutout portions 114, 116, 118, and 120 receive projecting portions of the drawer plate therethrough as described in further detail below. Large cutout 112 defines a locking portion 122 having an upper surface 124 connected at 123 to a downwardly and inwardly sloping surface 126 and has a lower surface 127. A tab 128 projects forwardly from the plate 110 and may be provided at an upper portion thereof.

Figure 9:
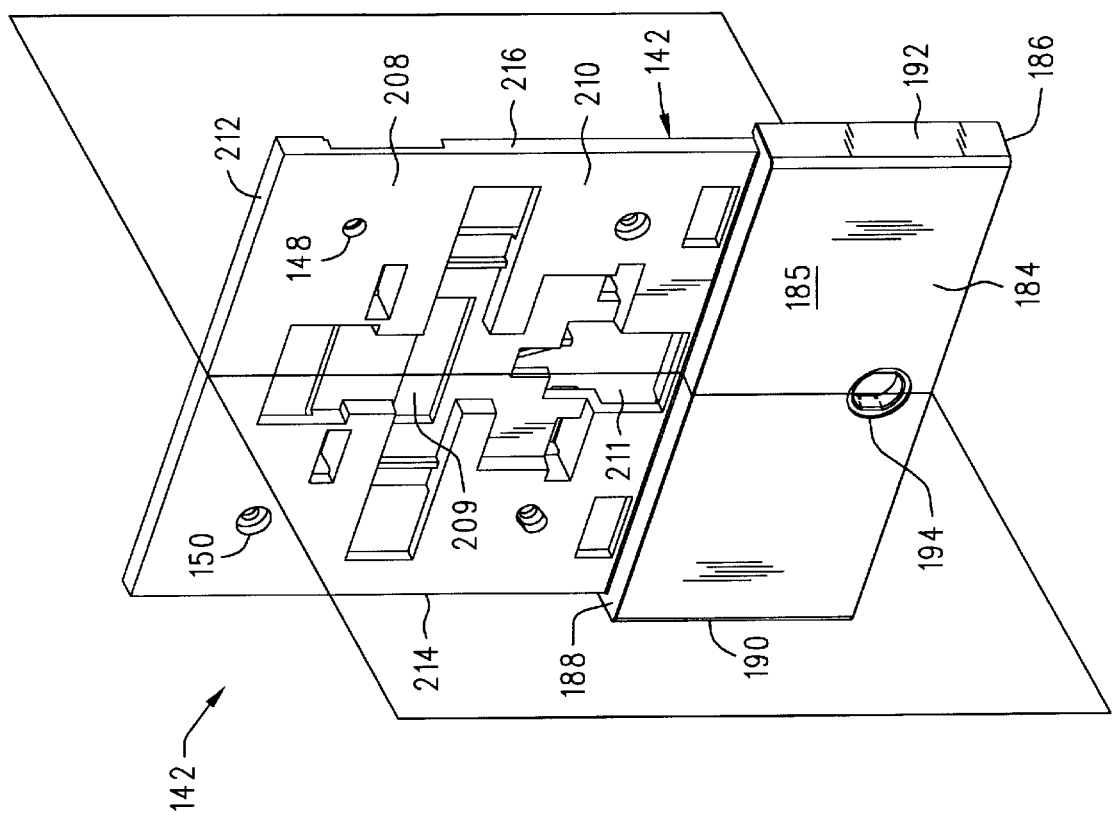
FIG. 9 is a front perspective of a drawer attachable plate portion of a drawer bezel assembly.
Figure 10:
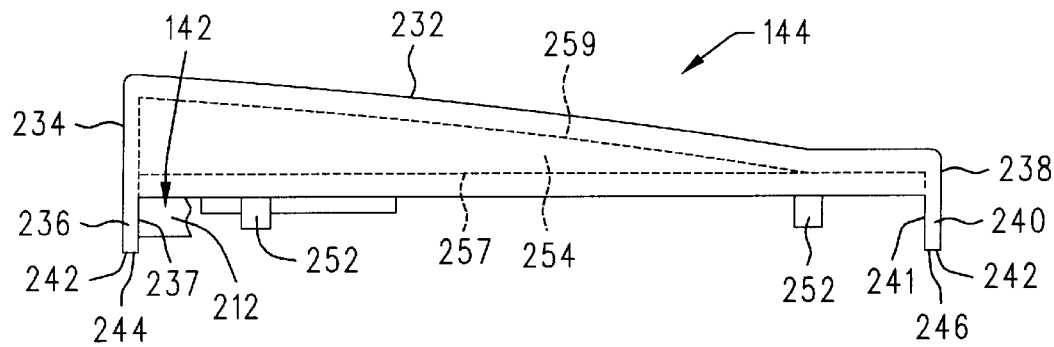
FIG. 10 is a top plan view of a removable plate portion of a drawer bezel assembly of which the bottom plan view is a mirror image.
Figure 11:
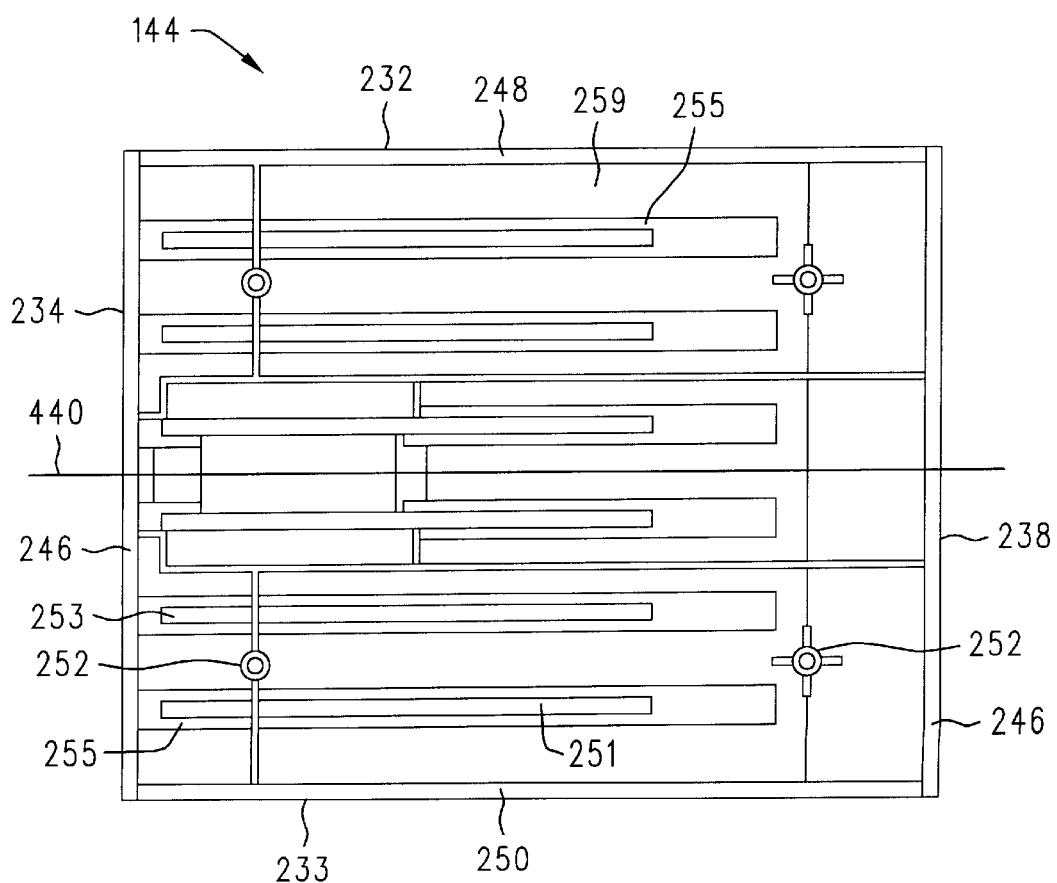
FIG. 11 is a rear elevation view of the removable plate portion of a drawer bezel assembly of FIG. 10.

Drawer bezel assembly 140, FIGS. 2–4, 6–8 and 19–21, comprises a drawer attachable plate portion 142, best illustrated in FIG. 9, and a removable plate portion 144, shown from the top and rear in FIGS. 10 and 11. The drawer attachable plate portion 142 comprises a rear face portion 146, FIG. 4, having bores 148, 150, etc. therein, FIG. 9 for attaching removable plate portion 144 as with screws 152. Drawer attachable plate portion 142 has raised surface portions 154, 156 adapted to abut the forward face of bracket 74 central wall portion 78. A plurality of rearwardly projecting stud portions 161-166 are provided at the rear surface 160 of plate portion 142. Each stud portion comprises a lip portion 170 having an inwardly positioned vertical surface portion 172 extending generally parallel to surfaces 154 and 156 and positioned rearwardly (outwardly) 174 thereof. The distance in direction 174 between surface 172 and surfaces 154, 156 is just slightly greater, e.g., 0.5 millimeters greater than the combined thickness of bracket 74 central wall portion 78 and plate 110 which may have thicknesses of e.g., 1.4 mm and 1.4 mm respectively. Each lip portion 170 has lateral side surfaces 171, 173 which are separated by a distance smaller, e.g., 2.2 mm smaller, than the distance between lateral edges 91, 93 of the holes 92, 94, etc. in bracket 74 central wall 78, FIGS. 6 and 7. Similarly, each lip 170 comprises top and bottom surfaces 175, 177 which are separated by a distance somewhat less than, e.g., 5.2 mm less than, the distance between top and bottom edges 95, 97 of the holes 92, 94, etc. in bracket 74. This size relationship between lip portions 170 and rectangular cutouts 92, 94, etc. enables a floating relationship between the bracket 74 and the drawer bezel assembly 140 which facilitates registration with a chin plate as explained in further detail below. Also, an upper recessed horizontal surface portion 169 extending parallel to and recessed, e.g., 2.5 mm from surface 175 limits downward displacement of plate 110 as described further below.

The drawer attachable plate portion 142 of the drawer bezel assembly 140 also has projecting from the rear surface thereof a deflectable member portion 176 which is adapted to be deflected in direction 178 by snap-on attachable plate 110 downwardly and inwardly sloping surface 126 and to thereafter elastically return in direction 179 to lock snap-on attachment plate 110 in position as described in further detail below. The deflectable member portion 176 has a bottom edge surface 182 which engages surface 124 of locking plate 110 when the locking plate is in the locked position illustrated in FIG. 8 and further described below.

FIG. 9 is a front perspective view of drawer bezel assembly drawer attachable plate portion 142. Plate portion 142 has a lower more forwardly projecting portion 184 having a rectangular shaped front face portion 185, a bottom face portion 186, a top face portion 188 and first and second lateral side face portions 190, 192 respectively. A lock opening 194 may be centered in portion 184 for receiving a lock assembly 195, FIG. 21 which co-acts with structure (not shown) inside the housing 30 to lock the media drawer when the lock assembly is suitably actuated as with a conventional key. The drawer attachable plate portion 142 may comprise an upper, less forwardly projecting portion 208, which may be integrally formed with portion 184 and which may have one or more vent openings 209, 211, etc. extending therethrough. Upper portion 208 may comprise a top face portion 212, lateral side face portions 214, 216 which may be laterally recessed, e.g., 3.8 mm, from side faces 190, 192. Upper portion 208 may also comprise a rectangular shaped front face portion 210 which may be recessed rearwardly, e.g., 8 mm, from front face portion 185.

Figure 6:
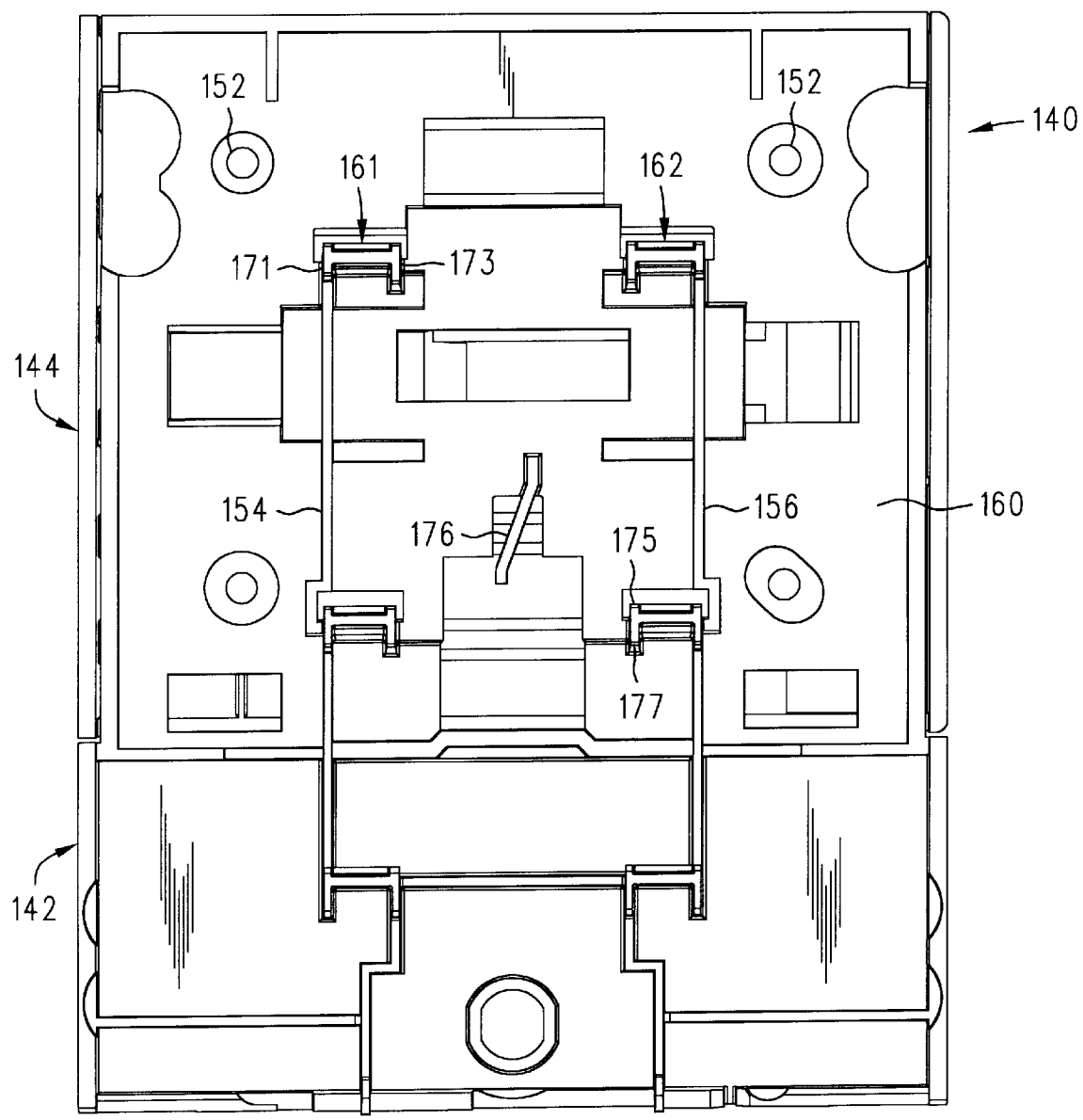
FIG. 6 is a rear elevation view of a drawer bezel assembly.

FIGS. 4 and 6–8 illustrate the manner by which drawer attachable plate 142 is attached to drawer bracket 74. FIG. 6 is a rear elevation view of plate portion 142 prior to engagement with drawer bracket 74. In FIG. 7 plate portion 142 has been positioned with the rearwardly projecting stud portions 161–166 thereof extending through the openings 92, 94, 96, 98, 102, 104 of drawer bracket 74. The bracket central wall 78 is positioned in abutting engagement with raised surface portions 154, 156 of drawer attachable plate portion 142. Next, locking plate 110 is positioned as illustrated in dashed lines in FIG. 8 with cutout portions 114, 116, 118, and 120 receiving stud portions 161 through 164 therethrough and with stud portions 165, 166 positioned below edge surfaces 130, 132. Next, as shown in FIG. 8, the plate 110 is urged downwardly, 220, as by pushing on tab 128 from the position shown in dashed lines to the position shown in solid lines. During this downward movement the downwardly and inwardly sloping surface 126 of the snap-on attachment plate 110 engages the lower portion of plate 142 deflectable member 176 urging it in direction 178 until it clears the tip 123 of locking portion 122, which corresponds with the engagement or near engagement of surfaces 115, 117, 119, 121, 130, and 132 with upper recessed horizontal surface portion 169, FIG. 4, of each of the stud members 161–166. In other words, plate 110 is captured with respect to vertical 220, 221 movement between an abutting surface 182 of deflectable member 176 and abutting surfaces 169 of stud members 161–166. Once positioned, as illustrated in solid lines in FIG. 8, the attachment plate 110 is also captured with respect to forward or rearward 174, FIG. 4, displacement. It is prevented from being removed in direction 174 by the abutting engagement between the rear vertical surface portion 172, FIG. 4, of each lip portion 170 and the flat face surface 111 of snap-on plate 110. In order to remove the snap-on plate 110 it is necessary for a user to move deflectable member portion 176 in direction 178 until it clears tip 123, FIG. 4, and thereafter to slide snap-on attachment plate 110 upwardly, 221, to a position where the plate is no longer engaged by the rear surface portion of the lip portions 170 of studs 161–166. Thereafter, the plate 110 may be moved rearwardly to remove it from the studs. Next, the drawer attachable plate portion 142 may be moved upwardly 221 with respect to the bracket plate 74 to position the upper edges 95 of holes 92, 94, etc. above the lip portions 170 of the stud portions. Finally, the drawer attachable plate portion 142 may be moved rearwardly, 174, FIG. 4, with respect to the bracket 74 to entirely remove it therefrom.

It will be appreciated from the above description that, even though the attachment plate 110 is prevented from moving with respect to the drawer attachable plate portion 142, the drawer attachable plate portion 142 is relatively displaceable with respect to the drawer bracket 74. Relative movement between plate portion 142 and bracket 74 in a direction parallel to bracket central wall portion 78 due to the fact that the cut out 92, 94, 96, 98, 102, 104 in the central wall portion 78 are larger, both vertically 221, 221 and horizontally 178, 179 than the studs 161–166 received therethrough. There is sufficient frictional contact between bracket central wall portion 78, which may be constructed from sheet metal, and the abuttingly engaged surfaces 154, 156 of plate portion 142 which may be constructed from high strength plastic, to ordinarily retain plate portion 142 in stationary relationship with respect to bracket central wall portion 78. However, this frictional engagement is sufficiently weak that a person of ordinary strength can move plate portion 142 both translationally and rotationally with respect to bracket central wall portion 78 (in translational directions parallel to wall portion 78 and rotational directions about axes perpendicular to central wall 78. Such displacement may be necessary to align plate portion 142 and attached removable plate portion 144 with adjacent bezel components such as central bezel plate 270 and/or chin plates 310, 330.

It will be appreciated by those having skill in the art that although plate portion 142 is the specifically described embodiment has six stud portions 161–166 that a similar floating attachment could be provided with one or any member of rear projections. Similarly, although member 176 is shown in an arrangement where it deflects laterally, any other snap lock configuration may be used such as, for example, an arrangement where member 123 projects in direction 174 rather than direction 178 and wherein member 176 moves in direction 174 and the opposite direction in order to snap lock into position. It is also to be understood that the snap fit relationship between plate portion 142 and attachment plate 110 may also be accomplished by one or more flexible members mounted on attachment plate 110 which coact with rigid surface portion projecting from plate portion 142. For example, a flexible member (not shown) similar in profile to member 176 but rotated 180° could be provided on plate 110. A rearwardly projecting locking stud (not shown) similar in profile to that of locking portion 122 but rotated 180° could be provided on plate portion 142. The flexible member (not shown) provided on the locking plate 110 and the locking stud (not shown) provided on plate portion 142 could be constructed and arranged such that the flexible member (not shown) was deflected laterally by the locking stud (not shown) during downward displacement of the plate 110 until it snapped laterally back to a position below the locking stud. In this position it would prevent the plate 110 from being moved upwardly because of the abutting engagement between the end of the flexible member (not shown) and the locking stud (not shown).

The above described mounting and dismounting of plate portion 142 from drawer bracket 74 would ordinarily be accomplished with removable plate portion 144 attached to drawer attachable plate portion 142. The structure of one embodiment of a removable plate portion 144 and a manner of attachment thereof to drawer attachable plate portion 142 will now be described with reference to FIGS. 2, 4, 10, and 11. Each removable plate portion 144 comprises first and second bottom/top wall portions 232, 233. The plate portion 144 comprises a first lateral side wall 234 having a first rearwardly projecting flange portion 236 having an inter-surface portion 237 which abuts plate 142 lateral side wall portion 216 or 214 depending upon whether plate 144 is mounted on a left-hand or right-hand drawer. Plate portion 144 also comprises a second lateral side face 238 with rearwardly projecting flange portion 240 having an inner-surface 241 adapted to abut surface 214 or 216. Plate portion 144 has a rear edge surface portion 242 comprising portions 244, 246 associated with flanges 236, 240 respectively. The removable plate has first and second horizontally extending peripheral rear edge surface portions 248, 250 which are recessed, e.g. 6.7 mm, from edge portions 244, 246 and extend transversely thereof. A plurality of screw receiving bosses 252, may be integrally formed with and project rearwardly from the removable plate portion 144. The bosses are positioned with respect to the lateral side face portions 234, 238, so as to be positioned in alignment with corresponding holes 148, 150, etc, in the drawer bracket attachable plate portion 142 for securing plate portion 144 to plate portion 142. The spacing between the inner surfaces 237, 241 of flange portions 236, 240 is substantially the same as the spacing between lateral side faced portions 214, 216 of member 142 to maintain lateral stability of the plate 144 when mounted on plate 142. Surfaces 248, 250 of removable plate portion 144 are positioned in abutting engagement with front face 210 of plate portion 142. Removable plate portion 144 comprises a plurality of vent openings 251, 253 extending therethrough from front to rear. The plane 257 of rear peripheral wall portion 255 positioned about each vent opening is preferably recessed e.g., 2.5 mm from the edge surface portions 248, 250 which abuttingly engage plate 142. Thus, the front face 210 of upper portion 208 of plate 142 and the rear surface 259 of plate 144 and inner surfaces 237, 241 of plate 144 lateral side walls 234, 238 define a plenum chamber (manifold) 254 which is in fluid communication with both vent openings 252, 253 in plate 144 and vent openings 209, 211, etc. in plate 142. Thus, the housing 30 is vented by air traveling through vent openings 251, 253, etc. and 209, 211, etc. and corresponding holes in bracket 74 and snap on plate. The plenum chamber obviates the need to alight the vent openings in plate 142 with those in plate 144.

Figure 12:
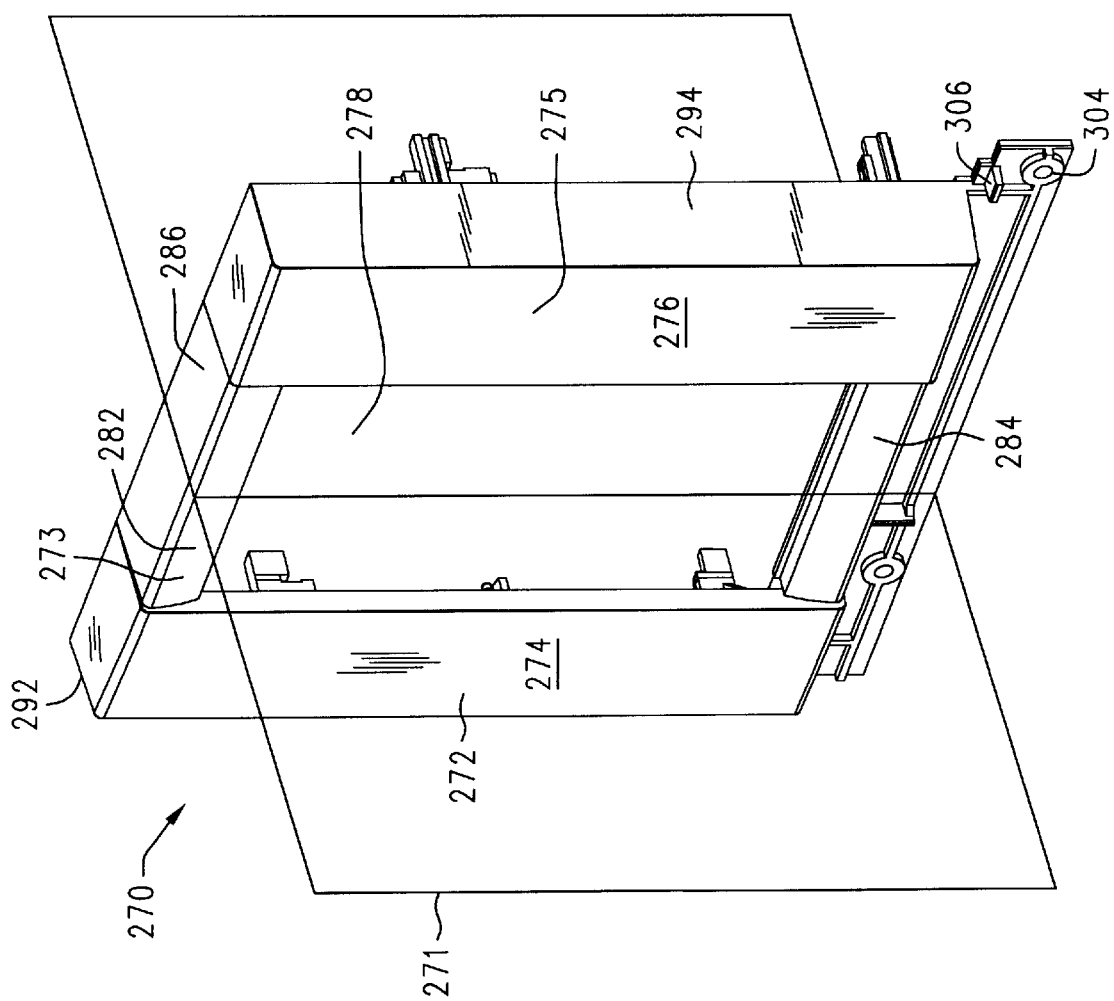
FIG. 12 is a front perspective view of a central plate of a bezel assembly.
Figure 13:
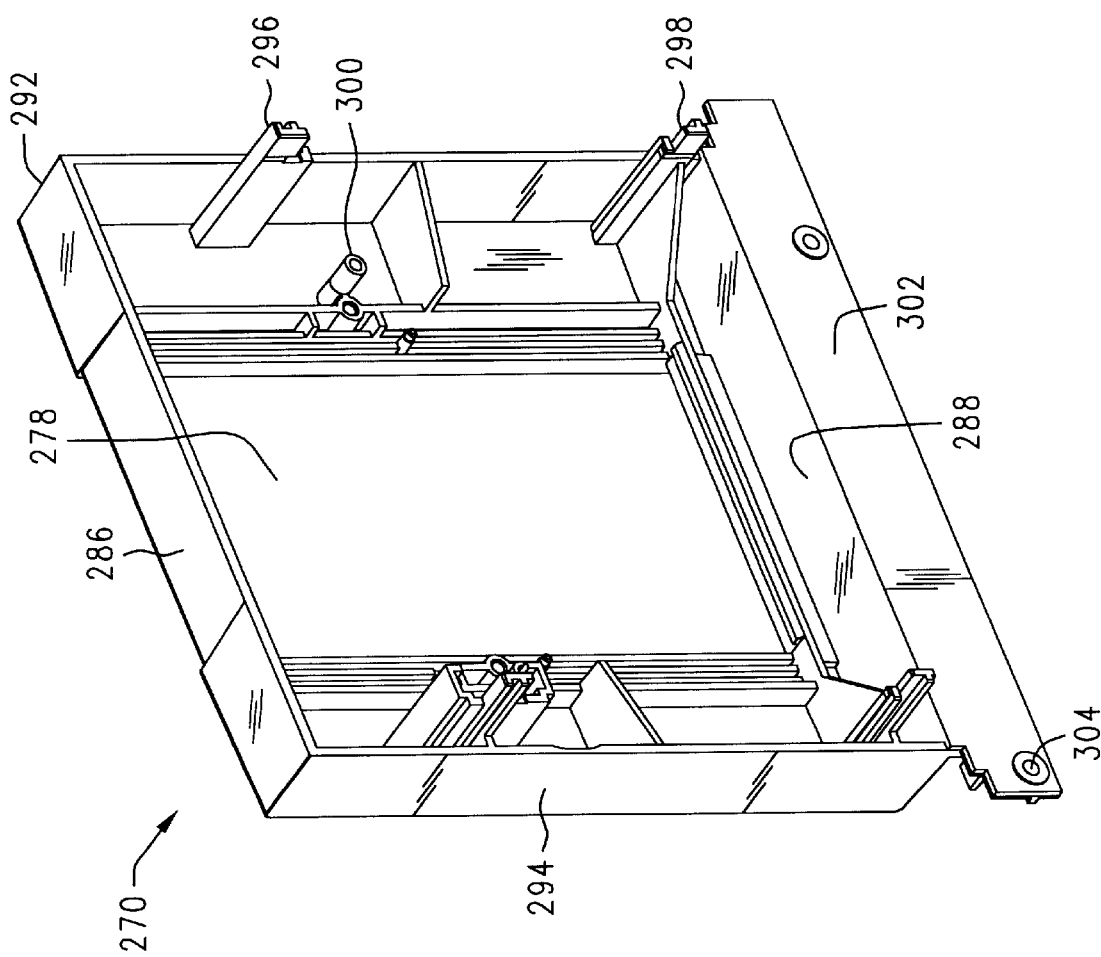
FIG. 13 is a rear perspective view of the central plate of FIG. 12.

FIGS. 12 and 13 illustrate a central bezel plate 270 having a plane of symmetry 271 dividing the plate into mirror image left and right halves 273, 275. The plate has a front face portion 272 having a rectangular periphery. The front face may include left and right opaque, vertically elongated rectangular panels 274, 276 extending from the top to the bottom of the front face. The front face may also include a central intermediate, vertically elongated, rectangular panel 278 which may be transparent. Panel 278 may extend between top and bottom opaque horizontally elongated panels 282, 284. In some configurations the central transparent panel 278 may be replaced, as shown in FIG. 1, by an upper plate 277 and a lower plate 283. The upper plate may be transparent and may have a control panel 279 positioned immediately behind it. The control panel may have buttons 280, 281, etc. projecting through corresponding holes in upper plate 277. Central bezel plate 270 may include a generally rectangular top face portion 286 and generally rectangular bottom face portion 288 as shown in FIGS. 12 and 13. The central bezel plate 270 may also include a generally rectangular left lateral side wall 292 and right lateral side wall 294. Projections 296, 298, etc. and bored bosses 300, etc. and lower flange 302 having bores 304, etc. therein are adapted to facilitated attachment of central plate 270 to the front face 42 of sheet metal housing 30 and/or attach chin plate 310 thereto. In a typical autochanger rack configuration only one of the bezel assemblies 28 provided on each housing would include a control unit. The other bezel assemblies would simply contain the single transparent plate 278 as best illustrated in FIG. 1. The central bezel plate may be constructed from any relatively rigid, durable material such as metal or high strength plastic.

Figure 14:
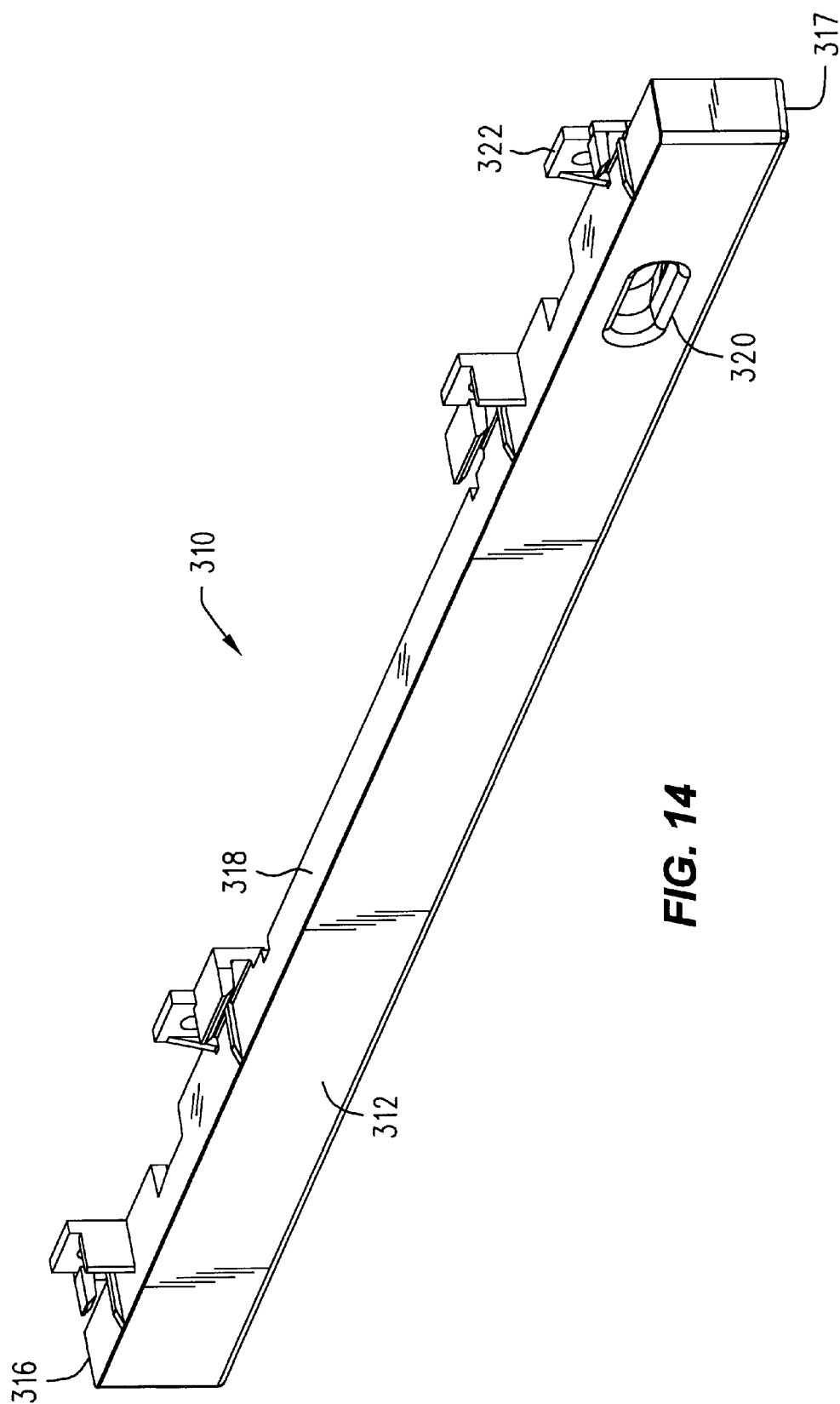
FIG. 14 is a front perspective view of a bottom chin plate of a bezel assembly.
Figure 15:
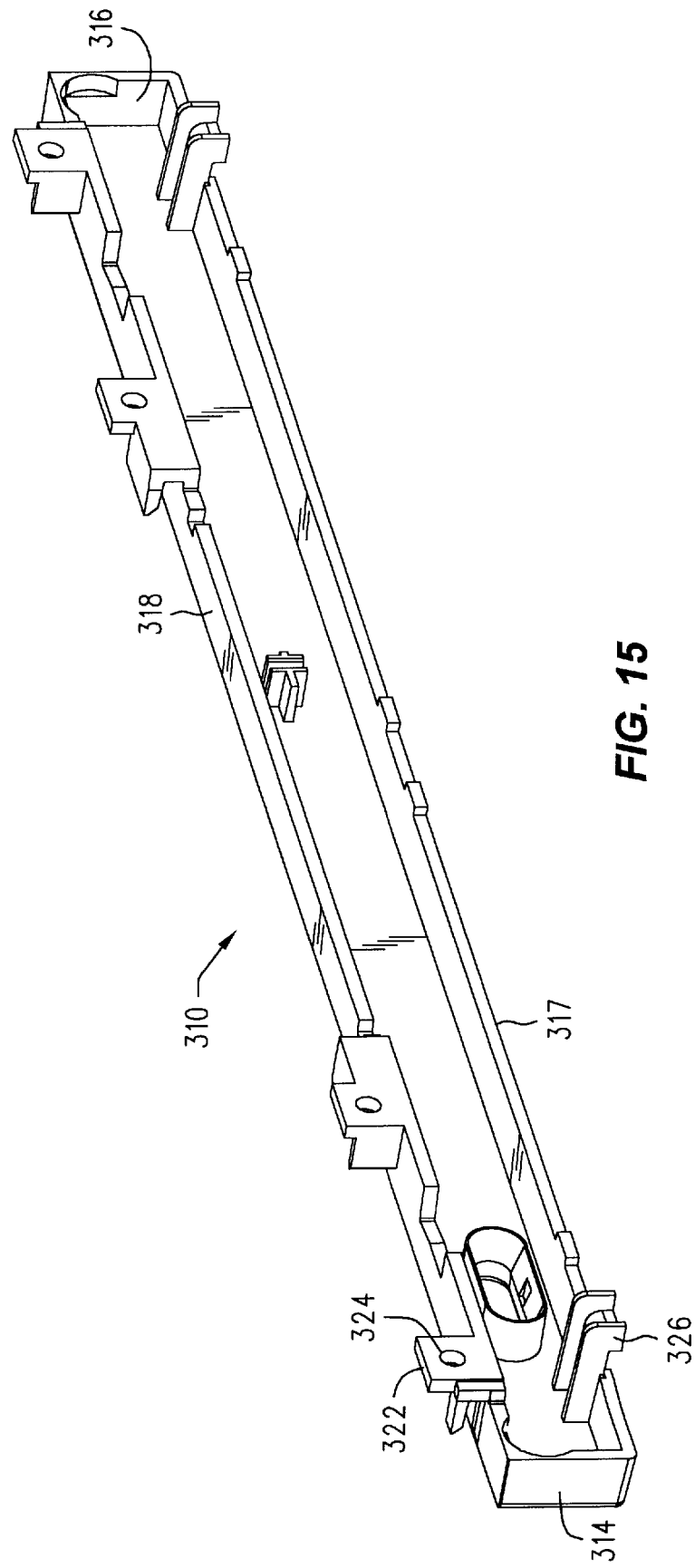
FIG. 15 is a rear perspective view of a bottom chin plate.
Figure 16:
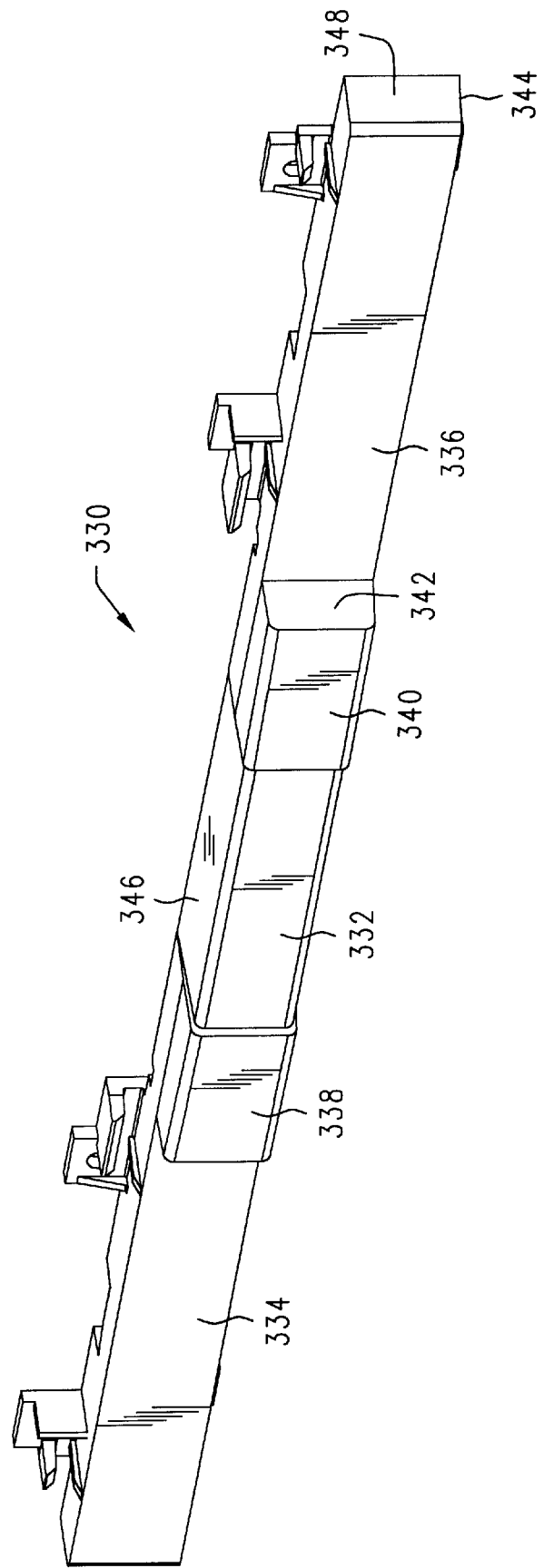
FIG. 16 is a front perspective view of a middle chin plate of a bezel assembly.

FIGS. 14 and 15 illustrate a chin plate 310 which is adapted to be used with the bottom most one in a stacked array of bezel assemblies 28 as illustrated in FIG. 1. The bottom chin plate 310 may have a generally flat rectangular front face portion 312, rectangular lateral side wall portion 314, 316 and a rectangular bottom wall 317. The front face may have a horizontally elongated bore 320 extending there through for the purpose of power switch access. A plurality of flanges 322, etc. screw receiving bores 324, etc. and rear projections 326, etc. are provided for attaching the bottom chin plate 310 to central plate flanges 302 and the housing 30. The bottom chin plate 310 is not attached to the drawer bezel assembly 140. A middle chin plate 330 which is adapted to be used with all bezel assemblies 28 in a stacked array, except for the bottom most bezel plate assembly is illustrated in FIG. 1 and FIG. 16. Depending upon the slot spacing distances in a rack 10 the middle chin plate 330 may have a height greater than, less than or equal to the height of the bottom chin plate 310. As best seen in FIG. 1 the middle chin plate 330 is configured to maintain a generally planar relationship with each portion of the bezel assembly 28 components that are positioned immediately above it. Thus, as illustrated in FIG. 16 the middle chin plate may comprise a front face having a central rectangular front wall portion 332 outer rectangular front wall portions 334, 336, and intermediate rectangular front face portions 338, 340. The outer face portions and intermediate face portions are connected by forwardly projecting portions 342 (only one shown). The central face portion 332 may be recessed slightly from the intermediate face portions 338, 340. The middle chin plate 330 has a bottom face portion 344 a top face portion 346 and opposite side face portions 348 (only one shown). The middle chin plate may have the same type of connector structure as described above with respect to the bottom chin plate 310. It will be seen from FIG. 1, FIG. 22, and FIG. 23 that the chin plates 310, 330 are adapted to be positioned immediately below associated drawer bezel assemblies 140 and central bezel plates 370. The chin plates are fixedly attached to the central bezel plates 270 and may serve as a reference structure for alignment of the left and right drawer bezel assemblies 142 which are positioned immediately above the left and right end portions of an associated chin plate. The above described structure for mounting the drawer bezel assembly on an associated drawer bracket 74 allows the drawer bezel assembly to "float" i.e., be displaced and rotated slightly in a horizontally and vertically extending plane perpendicular to plane 271. Thus, each drawer bezel assembly 140 may be hand rotated and vertically displaced if necessary to position it with the bottom face portion thereof in the exact parallel relationship with the top face portion of an associated chin plate 310 or 330.

Figure 17:
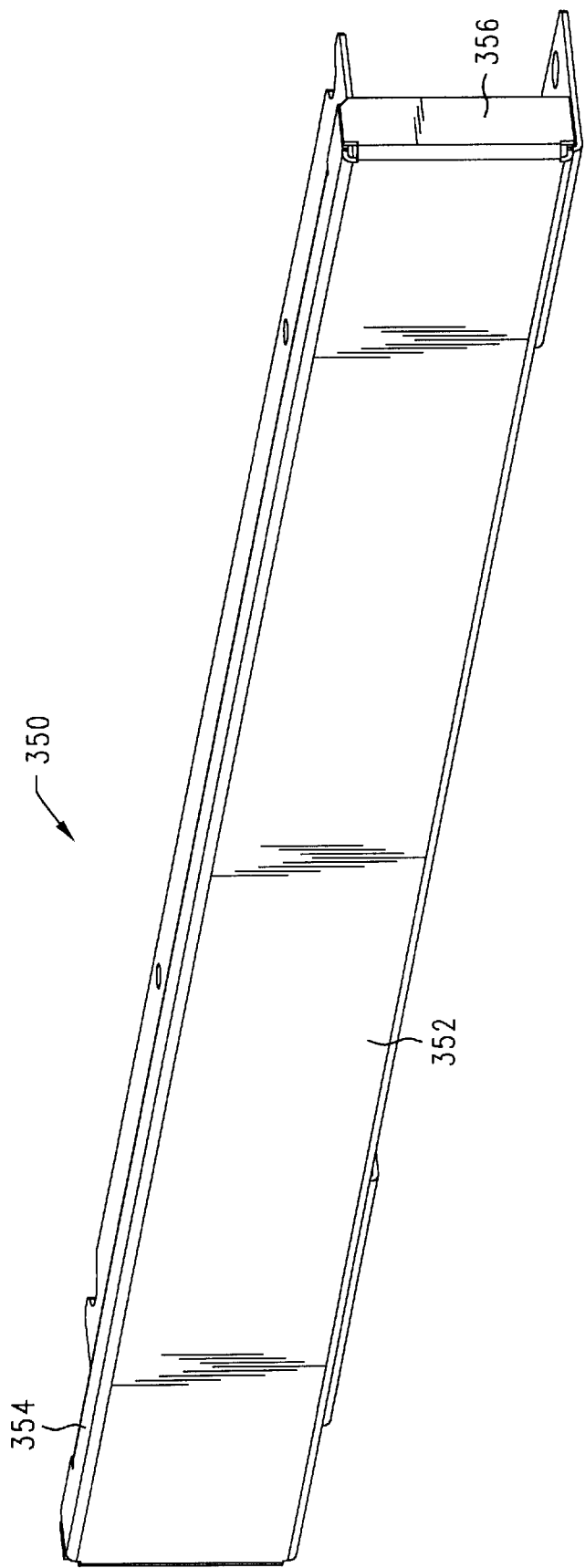
FIG. 17 is a front perspective view of a forehead plate of a bezel assembly.
Figure 18:
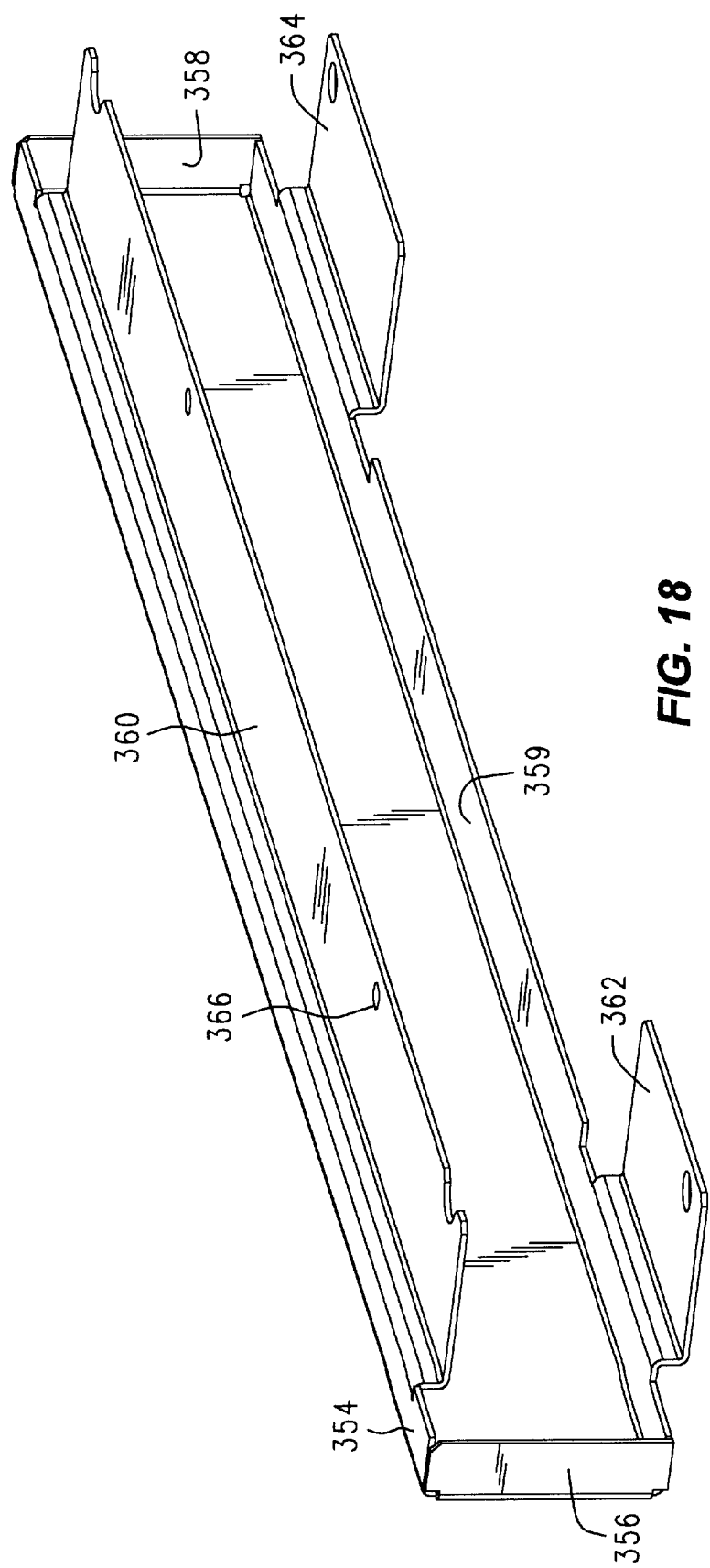
FIG. 18 is a rear perspective view of a forehead plate.

FIGS. 17 and 18 illustrate a forehead plate 350 which may have a smooth rectangular front face portion 352 a rectangular top face portion 354, rectangular lateral side face portions 356, 358 and a generally rectangular bottom face portion 359. A plurality of flanges 360, 362, 364 having bores 366, etc. there through are provided for attaching the forehead plate 350 to a top portion of rack 10 immediately above the uppermost bezel assembly 28 as shown in FIG. 1. Different height forehead plates may be used depending upon rack 10 configurations or, as shown in FIG. 23 the forehead plate may be eliminated in some embodiments.

Figure 19:
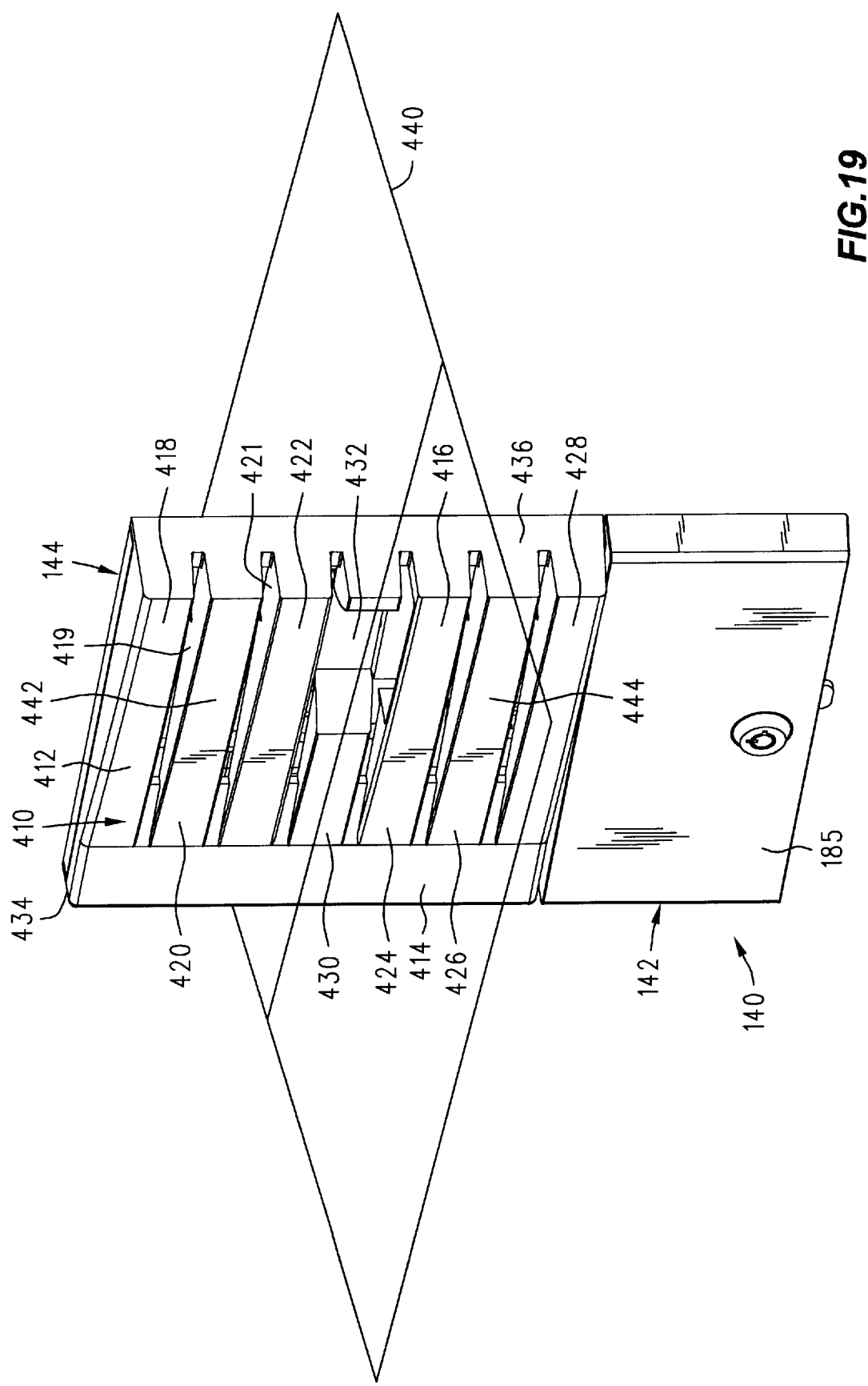
FIG. 19 is a front perspective view of one configuration of a drawer bezel assembly.

It is a feature of the bezel assembly 28 that it may be provided in multiple different configurations (e.g., 411 shown in FIG. 1, 461 shown in FIG. 23 and 501 shown in FIG. 22) by simply changing the appearance of bezel drawer removal plate portion 144. Drawer bezel assemblies 140 having three different removable plate portions 144 are illustrated in FIGS. 19, 20, and 21. In FIG. 19 the removal plate portion 144 is the same as the one shown and described above with reference to FIGS. 10 and 11. It may be seen from FIG. 19 that this configuration 410 of removal plate 144 has a front face portion 412 which includes a flat vertically elongated panel portion 414 and a beveled portion 416 integrally formed therewith. The beveled portion 416 includes a plurality of horizontally extending panel portions having parallel face surfaces 420, 422, 424, 426, and 428. Between these paneled portions are horizontally extending front vent openings 419, 421, etc. which correspond to previously described rear vent openings 351, 253, etc. Disposed between horizontally extending panel portions 422 and 424 is a horizontally extending panel portion 430 having a recessed portion 432 therein. Side wall portions associated with horizontally extending panel portions 422, 424 have upwardly and downwardly extending recesses therein, respectively. The regions of horizontally extending panel portions 422 and 424 adjacent to recess 430 may thus act as handles into which a user may insert one or more fingers in order to pull open the attached media holding drawer 54, FIG. 2. It may be seen from FIG. 19 that a horizontally extending plane of bilateral symmetry 440 divides this first removal plate configuration 410 into mirror image first and second halves 442, 444. As a result of the bilateral symmetry of configuration 410 it is necessary to have only one forming mold for producing removable plate portions 144 for this bezel assembly 28 configuration 411. The reason is that the removable plate 144 shown in FIG. 19 on a left hand drawer of the housing may be flipped 180 degrees so that lateral side face 238 is positioned on the left hand side thereof rather than the right hand side thereof. The panel portion 144 and this configuration may then be used in association with the right hand drawer. It will also be appreciated that because of the bilateral symmetry of drawer attachable plate portion 142 about a vertically extending plane that it too may be used on either a left hand or right hand drawer. Thus, in order to provide the portion of the bezel assembly 28 position between any two chin plates or a chin plate and forehead plate it is necessary to have only three molds to produce the five different separate plates that form that portion of bezel assembly 28. In other words, both the left hand and right hand removal plates 144 of configuration 410 may be formed from a single mold and both the drawer attachable plate portions 142 may be formed from a single mold. Central bezel plate portion 270, of course, also requires a separate mold. FIG. 1 illustrates the bezel assembly 28 configuration 411 in a three stack format 446.

A second configuration 460 of removable drawer plate portion 144, FIG. 20, is used to provide a second bezel assembly 28 configuration 461, FIG. 23. In this embodiment of the removable plate portion 144 a front face portion 462 comprises two outer vertically elongated rectangular panels 464, 468 having a plurality of ribs 470, 472, etc. extending horizontally therebetween. The ribs are divided by vent openings 474, 476, etc. Each of the ribs may be generally flat except for the bottom rib 478 which has a partial disk shape which extends outwardly from the other ribs and provides a grippable upper surface 480 and lower surface (not shown) for facilitating opening of the attached medial drawer 54. This plate has identical lateral side faces 463, 465. This configuration 460 has a vertical plane of bilateral symmetry 484 dividing it into first and second mirror image halves 486, 488. It will be appreciated that because of the bilateral symmetry about vertical plane 484 that configuration 460 may be used in association with either a left hand or a right hand drawer. Thus, the portion of the bezel assembly configuration 461 shown above chin plate 310 in FIG. 23 may also be provided with only three mold cavities. To the extent that a bezel manufacturer is manufacturing the bezel assembly configuration 411 shown in FIG. 1 it will be necessary to produce only a single additional mold in order to provide the bezel assembly shown in FIG. 23 since plate portions 142 and 270 of configuration 461 are identical to those of configuration 411 as are the chin and forehead plates. The plate configuration 460 may also be provided to form a plenum chamber between it and the associated drawer attachable plate portion 142 to provide the same venting capability as that of configuration 410. FIG. 23 in addition to showing bezel assembly configuration 463 also illustrates an autochanger in a one stack bezel array 50.

FIG. 21 illustrates a removable plate portion 144 in a third configuration 500 which provides a third bezel assembly configuration 501, FIG. 22. Third configuration 500 may be essentially identical to first configuration 410 except that the horizontally extending panel and vent arrangement is replaced by a plurality of rectangular holes 502, 504, etc. arranged in a plurality of rows 506, 508, 510, 512, and columns 514, 516, 518, 520. A user may stick the tips of her fingers into holes 502, 504, etc. in order to grip plate portion 144 to open the associated media drawer. Third configuration 500 has a horizontal plane of bilateral symmetry of 530 dividing the panel into mirror image first and second halves 532, 534. Like configuration 410 of FIG. 19 this removable plate configuration 500 may be used on the left hand drawer in a first orientation and used on the right hand drawer in a second orientation rotated 180 degrees from the first orientation. FIG. 22 illustrates bezel assemblies 28 mounted in a two stack array 540. It will of course be appreciated that any of the bezel assembly configurations 411, 461, 501, may be provided in a single stack, two stack, three stack, or any other multi stack array. It will also be understood that although specific removable plate portion 144 configurations have been described that any number of configurations could be provided which enable use of the removable plate portion 144 with either a left hand drawer or a right hand drawer so long as the plates have at least one plane of bilateral symmetry passing through them in the directions 173, 174 in which the media drawer opens and closes.

It is also to be understood that although the specific embodiments disclosed each have a drawer bezel assembly 28 with a drawer attachable plate portion 142 having its viewable face portion 185 positioned below the removable plate portion 144 that the relative position up and down of the drawer attachable plate portion and the removable plate portion could be reversed. It will also be appreciated that any of the drawer bezel assemblies of FIGS. 19 through 21 could be rotated 90 degrees either clockwise or counterclockwise and be vertically elongated and horizontally shorten. Such configuration would also provide the same features of bilateral symmetry within the entire bezel assembly 28, and ease of modification through changing the removable plate portion, which is provided in the above specifically described embodiments of FIGS. 19 through 21. Also, although the above embodiments have been described with respect to a media autochanger housing 30 having only a single left hand drawer and a single right hand drawer positioned about a central panel these same basic features would be applicable to an autochanger or other device having any number of drawers with or without a stationary central panel. It is to be noted that in all of the bezel configurations 28 shown that the entire bezel configuration 28 has bilateral symmetry about the central vertical plane 271 of the central plate 270.

While illustrative and presently preferred embodiments of the invention have been described above, it should be understood that the inventive concepts may be otherwise variously embodied and employed and that the appended claims are intended to be construed to include such variations except insofar as limited by the prior art.

What is claimed is:

1. A bezel assembly for a modular rack mounted device comprising:
   a) a unitary central plate having a rectangular front face portion, a top face portion, a bottom face portion, a first lateral side face portion, and a second lateral side face portion and having a central longitudinal plane extending parallel to said lateral side face portions, said central plate being symmetrical about said central longitudinal plane;
   b) a first side plate having a rectangular front face portion, a top face portion, a bottom face portion, a first lateral side face portion, and a second lateral side face portion, and having a central longitudinal plane extending parallel to said lateral side face portions, and having a central lateral plane extending parallel to said top and bottom face portions, said first side plate being bilaterally symmetrical about at least one of said central planes thereof, said first side plate being disposed with one of said lateral side face portions thereof in adjacent relationship with said first lateral side face portion of said central plate; and
   c) a second side plate identical to said first side plate, having a rectangular front face portion, a top face portion, a bottom face portion, a first lateral side face portion, and a second lateral side face portion, and having a central longitudinal plane extending parallel to said lateral side face portions, and having a central lateral plane extending parallel to said top and bottom face portions, said second side plate being bilaterally symmetrical about at least one of said central planes thereof, said second side plate being disposed with one of said lateral side face portions thereof in adjacent relationship with said second lateral side face portion of said central plate;
   said side plates each being bilaterally symmetrical about one and only one of said central planes thereof
   said side plates each being bilaterally symmetrical about said central lateral plane thereof, said first side plate being disposed with said second lateral side face portion thereof in adjacent relationship with said first lateral side face portion of said central plate, said second side plate being disposed with said second lateral side face portion thereof in adjacent relationship with said second lateral side face portion of said central plate.

2. A bezel assembly for a modular rack mounted device comprising:
   a) a unitary central plate having a rectangular front face portion, a top face portion, a bottom face portion, a first lateral side face portion, and a second lateral side face portion and having a central longitudinal plane extending parallel to said lateral side face portions, said central plate being symmetrical about said central longitudinal plane;
   b) a first side plate having a rectangular front face portion, a top face portion, a bottom face portion, a first lateral side face portion, and a second lateral side face portion, and having a central longitudinal plane extending parallel to said lateral side face portions, and having a central lateral plane extending parallel to said top and bottom face portions, said first side plate being bilaterally symmetrical about at least one of said central planes thereof, said first side plate being disposed with one of said lateral side face portions thereof in adjacent relationship with said first lateral side face portion of said central plate; and
   c) a second side plate identical to said first side plate, having a rectangular front face portion, a top face portion, a bottom face portion, a first lateral side face portion, and a second lateral side face portion, and having a central longitudinal plane extending parallel to said lateral side face portions, and having a central lateral plane extending parallel to said top and bottom face portions, said second side plate being bilaterally symmetrical about at least one of said central planes thereof, said second side plate being disposed with one of said lateral side face portions thereof in adjacent relationship with said second lateral side face portion of said central plate;
   d) a third side plate having a first rectangular front face portion with a top face portion, a bottom face portion, a first lateral side face portion, and a second lateral side face portion contiguous with said first rectangular front face portion, and having a central longitudinal plane extending parallel to said lateral side face portions, and having a central lateral plane extending parallel to said top and bottom face portions, said third side plate being bilaterally symmetrical about at least one of said central planes thereof, said third side plate being disposed with one of said lateral side face portions thereof in adjacent relationship with said first lateral side face portion of said central plate and said top face portion thereof in adjacent relationship with said bottom face portion of said first side plate; and
   e) a fourth side plate identical to said third side plate, having a first rectangular front face portion with a top face portion, a bottom face portion, a first lateral side face portion, and a second lateral side face portion contiguous with said first rectangular front face portion, and having a central longitudinal plane extending parallel to said lateral side face portions, and having a central lateral plane extending parallel to said top and bottom face portions, said fourth side plate being bilaterally symmetrical about at least one of said central planes thereof, said fourth side plate being disposed with one of said lateral side face portions thereof in adjacent relationship with said second lateral side face portion of said central plate and said top face portion thereof in adjacent relationship with said bottom face portion of said second side plate.

3. The bezel assembly of claim 2 wherein said third side plate comprises a second rectangular front face portion positioned in recessed adjacent relationship with said first front face portion thereof, said second rectangular front face portion having at least one vent opening extending therethrough, said first side plate having at least one vent opening extending through said rectangular front surface portion thereof, said first side plate and said second front face portion of said third side plate defining a plenum chamber therebetween, said at least one vent opening extending through said first side plate and said at least one vent opening extending through said second front face portion of said third side plate being in fluid communication with said plenum chamber.

4. A bezel assembly comprising:
   a) a plurality of bezel modules disposed in vertically stacked relationship each bezel module comprising:
      i) a unitary central plate having a rectangular front face portion, a top face portion, a bottom face portion, a first lateral side face portion, and a second lateral side face portion and having a central longitudinal plane extending parallel to said lateral side face portions, said central plate being symmetrical about said central longitudinal plane;

ii) a first side plate having a rectangular front face portion, a top face portion, a bottom face portion, a first lateral side face portion, and a second lateral side face portion, and having a central longitudinal plane extending parallel to said lateral side face portions, and having a central lateral plane extending parallel to said top and bottom face portions, said first side plate being bilaterally symmetrical about at least one of said central planes thereof, said first side plate being disposed with one of said lateral side face portions thereof in adjacent relationship with said first lateral side face portion of said central plate; and iii) a second side plate identical to said first side plate, having a rectangular front face portion, a top face portion, a bottom face portion, a first lateral side face portion, and a second lateral side face portion, and having a central longitudinal plane extending parallel to said lateral side face portions, and having a central lateral plane extending parallel to said top and bottom face portions, said first side plate being bilaterally symmetrical about at least one of said central planes thereof said second side plate being disposed with one of said lateral side face portions thereof in adjacent relationship with said second lateral side face portion of said central plate;

iv) a third side plate having a first rectangular front face portion with a top face portion, a bottom face portion, a first lateral side face portion, and a second lateral side face portion contiguous with said first rectangular front face portion, and having a central longitudinal plane extending parallel to said lateral side face portions, and having a central lateral plane extending parallel to said top and bottom face portions, said third side plate being bilaterally symmetrical about at least one of said central planes thereof, said third side plate being disposed with one of said lateral side face portions thereof in adjacent relationship with said first lateral side face portion of said central plate and one of said top face portion and said bottom face portion thereof in adjacent relationship with said bottom face portion of said first side plate; and v) a fourth side plate identical to said third side plate, having a first rectangular front face portion with a top face portion, a bottom face portion, a first lateral side face portion, and a second lateral side face portion contiguous with said first rectangular front face portion, and having a central longitudinal plane extending parallel to said lateral side face portions, and having a central lateral plane extending parallel to said top and bottom face portions, said fourth side plate being bilaterally symmetrical about at least one of said central planes thereof, said fourth side plate being disposed with one of said lateral side face portions thereof in adjacent relationship with said second lateral side face portion of said central plate and said top face portion thereof in adjacent relationship with said bottom face portion of said second side plate; and b) a plurality of identical intermediate span plates disposed, respectively, between each pair of adjacent bezel modules.

5. The bezel assembly of claim 4, further comprising:
a) a top span plate disposed above the upper most one of said stacked bezel modules; and
b) a bottom span plate disposed below the lower most one of said stacked bezel modules.

6. The bezel assembly of claim 4 wherein said third side plate comprises a second rectangular front face portion positioned in recessed adjacent relationship with said first front face portion thereof, said second rectangular front face portion having at least one vent opening extending therethrough, said first side plate having at least one vent opening extending through said rectangular front face portion thereof, said first side plate and said second front face portion of said third side plate defining a plenum chamber therebetween, said at least one vent opening extending through said first side plate and said at least one vent opening extending through said second front face portion of said third side plate being in fluid communication with said plenum chamber.

7. A kit for producing a plurality of different bezels for a housing comprising:
a) a plurality of identical central plates, each being bilaterally symmetrical about a plane of symmetry and having first and second lateral side face portions extending generally parallel to said plane of symmetry;
b) a first plurality of identical side plates, each having a front face portion with a first front surface configuration, first and second parallel lateral side face portions and each being bilaterally symmetrical about a plane of symmetry whereby a first one of said first plurality of identical side plates is positionable with one of said lateral side face portions thereof in adjacent parallel relationship with said first lateral side face portion of one of said central plates and another of said first plurality of identical side plates is positionable with one of said lateral side face portions thereof in adjacent parallel relationship with said second lateral side face portion of said central plate to provide a first three plate bezel configuration which is bilaterally symmetrical about said plane of symmetry of said central plate; and
c) at least a second plurality of identical side plates, each having a front face portion with a second front surface configuration different from said first front surface configuration, first and second parallel lateral side face portions and each being bilaterally symmetrical about a plane of symmetry whereby a first one of said second plurality of identical side plates is positionable with one of said lateral side face portions thereof in adjacent parallel relationship with said first lateral side face portion of one of said central plates and another of said second plurality of identical side plates is positionable with one of said lateral side face portions thereof in adjacent parallel relationship with said second lateral side face portion of said central plate to provide a second three plate bezel configuration which is bilaterally symmetrical about said plane of symmetry of said central plate and which is different in appearance from said first three plate bezel configuration;
each of said first and second plurality of side plates being bilaterally symmetrical about one and only one plane of symmetry;
wherein said plane of symmetry of each of said first plurality of identical side plates is parallel to said first and second lateral side face portions thereof;
wherein said plane of symmetry of each of said second plurality of identical side plates is perpendicular to said first and second lateral side face portions thereof.

8. A kit for producing a plurality of different bezels for a housing comprising:
a) a plurality of identical central plates, each being bilaterally symmetrical about a plane of symmetry and having first and second lateral side face portions extending generally parallel to said plane of symmetry;

b) a first plurality of identical side plates, each having a front face portion with a first front surface configuration, first and second parallel lateral side face portions and each being bilaterally symmetrical about a plane of symmetry whereby a first one of said first plurality of identical side plates is positionable with one of said lateral side face portions thereof in adjacent parallel relationship with said first lateral side face portion of one of said central plates and another of said first plurality of identical side plates is positionable with one of said lateral side face portions thereof in adjacent parallel relationship with said second lateral side face portion of said central plate to provide a first three plate bezel configuration which is bilaterally symmetrical about said plane of symmetry of said central plate; and c) at least a second plurality of identical side plates, each having a front face portion with a second front surface configuration different from said first front surface configuration, first and second parallel lateral side face portions and each being bilaterally symmetrical about a plane of symmetry whereby a first one of said second plurality of identical side plates is positionable with one of said lateral side face portions thereof in adjacent parallel relationship with said first lateral side face portion of one of said central plates and another of said second plurality of identical side plates is positionable with one of said lateral side face portions thereof in adjacent parallel relationship with said second lateral side face portion of said central plate to provide a second three plate bezel configuration which is bilaterally symmetrical about said plane of symmetry of said central plate and which is different in appearance from said first three plate bezel configuration;

each of said first and second plurality of side plates being bilaterally symmetrical about one and only one plane of symmetry;

wherein said plane of symmetry of each of said first plurality of identical side plates is perpendicular to said first and second lateral side face portions thereof.

9. The kit of claim 4, wherein said plane of symmetry of each of said second plurality of identical side plates is perpendicular to said first and second lateral side face portions thereof.

10. A method of producing housing assemblies comprising:

a) providing a plurality of identical housing frames;

b) providing a plurality of identical central bezel plates each being bilaterally symmetrical about a plane of symmetry and having first and second lateral side face portions extending generally parallel to said plane of symmetry;

c) providing a plurality of first identical side plates, each having a front face portion with a first front surface configuration, first and second parallel lateral side face portions and each being bilaterally symmetrical about a plane of symmetry;

d) providing one or more other sets of identical side plates including at least a plurality of second identical side plates, each having a front face portion with a second front surface configuration different from said first front surface configuration, first and second parallel lateral side face portions and each being bilaterally symmetrical about a plane of symmetry;

e) mounting pairs of said plurality of identical first side plates on individual ones of said plurality of identical housing frames with one of said identical central plates disposed between each of said pairs of first side plates in a plate arrangement which is bilaterally symmetrical about said plane of symmetry of said central plate to provide a plurality of housing assemblies having a first bezel configuration;

f) mounting pairs of said plurality of identical second side plates on individual ones of said plurality of identical housing frames with one of said identical central plates disposed between each of said pairs of second side plates in a plate arrangement which is bilaterally symmetrical about said plane of symmetry of said central plate to provide a plurality of housing assemblies having a second bezel configuration;

wherein each step of providing identical side plates comprises providing side plates which are all each bilaterally symmetrical about one and only one plane of symmetry thereof;

wherein said first step of providing a plurality of first identical side plates comprises providing plates with said plane of symmetry thereof parallel to said first and second lateral side face portions thereof;

wherein said step of providing a plurality of second identical side plates comprises providing plates with said plane of symmetry thereof perpendicular to said first and second lateral side face portions thereof.

11. A method of producing housing assemblies comprising:

a) providing a plurality of identical housing frames;

b) providing a plurality of identical central bezel plates each being bilaterally symmetrical about a plane of symmetry and having first and second lateral side face Dortions extending generally parallel to said plane of symmetry;

providing a plurality of first identical side plates, each having a front face portion with a first front surface configuration, first and second parallel lateral side face portions and each being bilaterally symmetrical about a plane of symmetry;

d) providing one or more other sets of identical side plates including at least a plurality of second identical side plates, each having a front face portion with a second front surface configuration different from said first front surface configuration, first and second parallel lateral side face portions and each being bilaterally symmetrical about a plane of symmetry;

e) mounting pairs of said plurality of identical first side plates on individual ones of said plurality of identical housing frames with one of said identical central plates disposed between each of said pairs of first side plates in a plate arrangement which is bilaterally symmetrical about said plane of symmetry of said central plate to provide a plurality of housing assemblies having a first bezel configuration;

f) mounting pairs of said plurality of identical second side plates on individual ones of said plurality of identical housing frames with one of said identical central plates disposed between each of said pairs of second side plates in a plate arrangement which is bilaterally symmetrical about said plane of symmetry of said central plate to provide a plurality of housing assemblies having a second bezel configuration;

wherein each step of providing identical side plates comprises providing side plates which are all each bilaterally symmetrical about one and only one plane of symmetry thereof;

wherein said step of providing a plurality of first identical side plates comprises providing plates with said plane of symmetry thereof perpendicular to said first and second lateral side face portions thereof.

12. The method of producing housing assemblies of claim 11 wherein said step of providing a plurality of second identical side plates comprises providing plates with said plane of symmetry thereof perpendicular to said first and second lateral side face portions thereof.

* * * * *

UNITED STATES PATENT AND TRADEMARK OFFICE
CERTIFICATE OF CORRECTION

PATENT NO.    : 6,183,053 B1
DATED         : February 6, 2001
INVENTOR(S)   : Wayne E. Foslien et al.

It is certified that error appears in the above-identified patent and that said Letters Patent is hereby corrected as shown below:

<u>Column 14,</u>
Line 50, delete "surface" and insert therefor -- face --

<u>Column 17,</u>
Line 43, delete "claim 4" and insert therefor -- claim 8 --

<u>Column 18,</u>
Line 35, delete "Dortions" and insert therefor -- portions --

Signed and Sealed this

Twenty-ninth Day of October, 2002

*Attest:*

*Attesting Officer*

JAMES E. ROGAN
*Director of the United States Patent and Trademark Office*